(12) United States Patent
Ichijo et al.

(10) Patent No.: US 7,199,027 B2
(45) Date of Patent: Apr. 3, 2007

(54) METHOD OF MANUFACTURING A SEMICONDUCTOR FILM BY PLASMA CVD USING A NOBLE GAS AND NITROGEN

(75) Inventors: Mitsuhiro Ichijo, Tochigi (JP);
Taketomi Asami, Saitama (JP);
Noriyoshi Suzuki, Kanagawa (JP);
Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 653 days.

(21) Appl. No.: 10/190,755

(22) Filed: Jul. 9, 2002

(65) Prior Publication Data
US 2004/0224486 A1   Nov. 11, 2004

(30) Foreign Application Priority Data
Jul. 10, 2001   (JP)   ............................. 2001-209239
Sep. 27, 2001  (JP)   ............................. 2001-295341

(51) Int. Cl.
*H01L 21/205*   (2006.01)
(52) U.S. Cl. ...................... 438/476; 438/485; 438/486
(58) Field of Classification Search ................. 438/476
See application file for complete search history.

(56) References Cited

U.S. PATENT DOCUMENTS

| | | |
|---|---|---|
| 4,643,527 A | 2/1987 | Magarino et al. |
| 4,646,424 A | 3/1987 | Parks et al. |
| 4,908,330 A | 3/1990 | Arai et al. |
| 5,248,630 A | 9/1993 | Serikawa et al. |
| 5,641,380 A | 6/1997 | Yamazaki et al. |
| 5,643,826 A | 7/1997 | Ohtani et al. |
| 5,736,438 A | 4/1998 | Nishimura et al. |
| 5,789,284 A | 8/1998 | Yamazaki et al. |
| 5,923,962 A | 7/1999 | Ohtani et al. |
| 6,013,544 A | 1/2000 | Makita et al. |
| 6,048,758 A | 4/2000 | Yamazaki et al. |

(Continued)

FOREIGN PATENT DOCUMENTS

EP       0 651 431 B1    3/2002

(Continued)

OTHER PUBLICATIONS

U.S. Appl. No. 10/157,843; Filed May 31, 2002 "Semiconductor Film, Semiconductor Device and Method for Manufacturing Same" (Filing Receipt, Specification, Claims and Drawings).

(Continued)

*Primary Examiner*—Stephen W. Smoot
(74) *Attorney, Agent, or Firm*—Nixon Peabody LLP; Jeffrey L. Costellia

(57) ABSTRACT

There is provided a technique for effectively removing a metallic element for promoting crystallization in a semiconductor film with a crystalline structure after the semiconductor film is obtained using the metallic element, to reduce a variation between elements. In a step of forming a gettering site, a plasma CVD method is used and a film formation is conducted using raw gas including monosilane, noble gas, and nitrogen to obtain a semiconductor film which includes the noble gas element at a high concentration, specifically, a concentration of $1\times10^{20}/cm^3$ to $1\times10^{21}/cm^3$ and has an amorphous structure, typically, an amorphous silicon film.

23 Claims, 19 Drawing Sheets

U.S. PATENT DOCUMENTS

| | | |
|---|---|---|
| 6,071,766 A | 6/2000 | Yamazaki et al. |
| 6,177,302 B1 | 1/2001 | Yamazaki et al. |
| 6,285,042 B1 | 9/2001 | Ohtani et al. |
| 6,309,966 B1 * | 10/2001 | Govindarajan et al. ..... 438/656 |
| 6,335,541 B1 | 1/2002 | Ohtani et al. |
| 6,429,097 B1 | 8/2002 | Voutsas et al. |
| 6,686,262 B2 | 2/2004 | Yamazaki et al. |
| 6,743,700 B2 * | 6/2004 | Asami et al. ............... 438/476 |
| 2001/0054430 A1 * | 12/2001 | Katagiri et al. .............. 134/1.1 |
| 2002/0098628 A1 | 7/2002 | Hamada et al. |
| 2002/0102764 A1 | 8/2002 | Yamazaki et al. |
| 2002/0125480 A1 | 9/2002 | Nakamura et al. |
| 2002/0134981 A1 | 9/2002 | Nakamura et al. |
| 2002/0151120 A1 | 10/2002 | Yamazaki et al. |
| 2002/0155652 A1 | 10/2002 | Yamazaki et al. |
| 2002/0182785 A1 | 12/2002 | Miyairi |
| 2002/0197785 A1 | 12/2002 | Yamazaki et al. |
| 2005/0020037 A1 | 1/2005 | Asami et al. |

FOREIGN PATENT DOCUMENTS

| | | |
|---|---|---|
| JP | 05-109737 | 4/1993 |
| JP | 07-183540 | 7/1995 |
| JP | 08-078329 | 3/1996 |
| JP | 09-134882 | 5/1997 |

OTHER PUBLICATIONS

U.S. Appl. No. 10/155,986; Filed May 29, 2002 "Semiconductor Film, Semiconductor Device and Method of Their Production" (Filing Receipt, Specification, Claims and Drawings).

Naohara Sugiyama, "*Strained Silicon Crystal on SiGe Substrate*", Applied Physics; vol. 69, No. 11, pp. 1315-1319 (Japanese and Full English translation).

\* cited by examiner

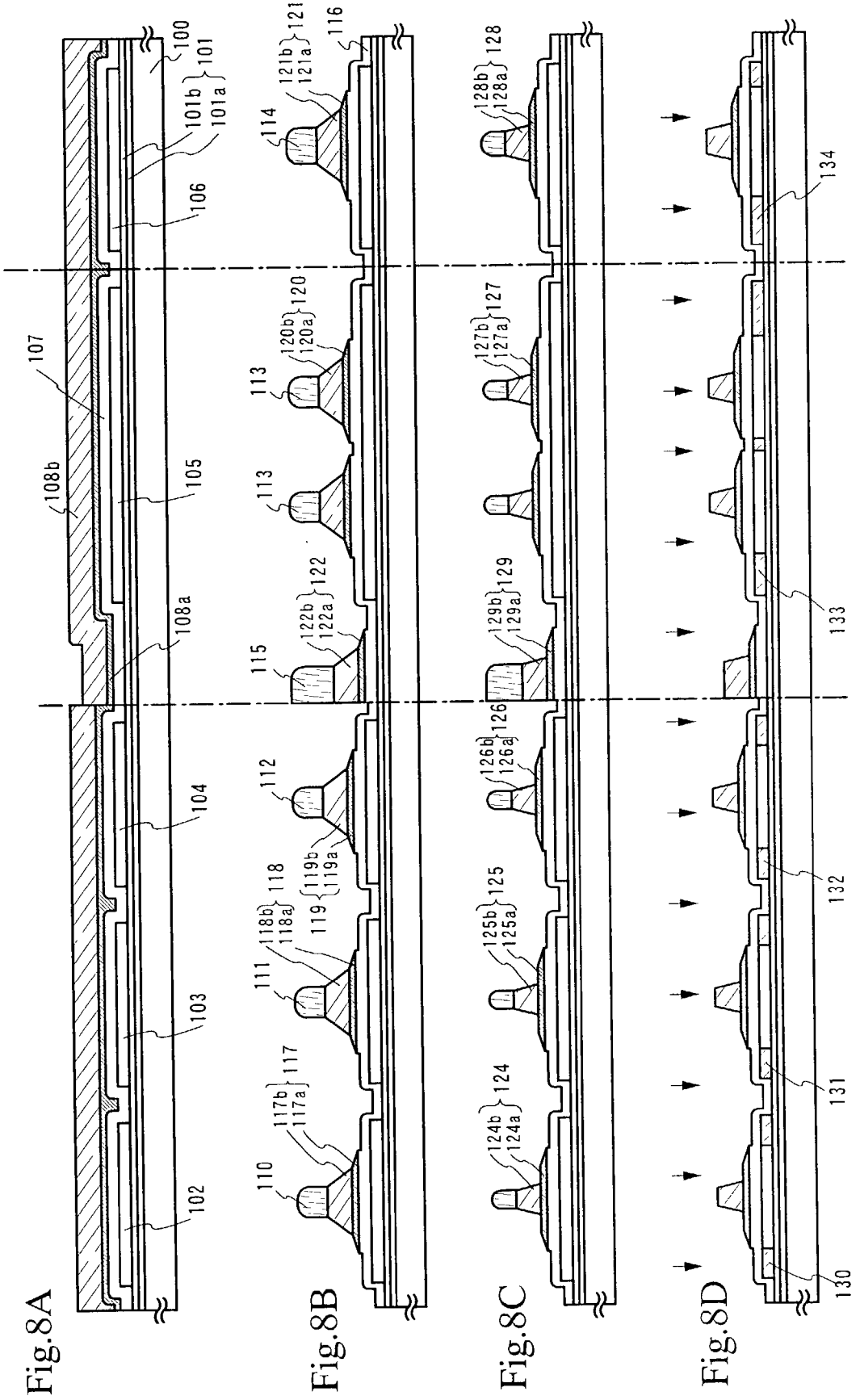

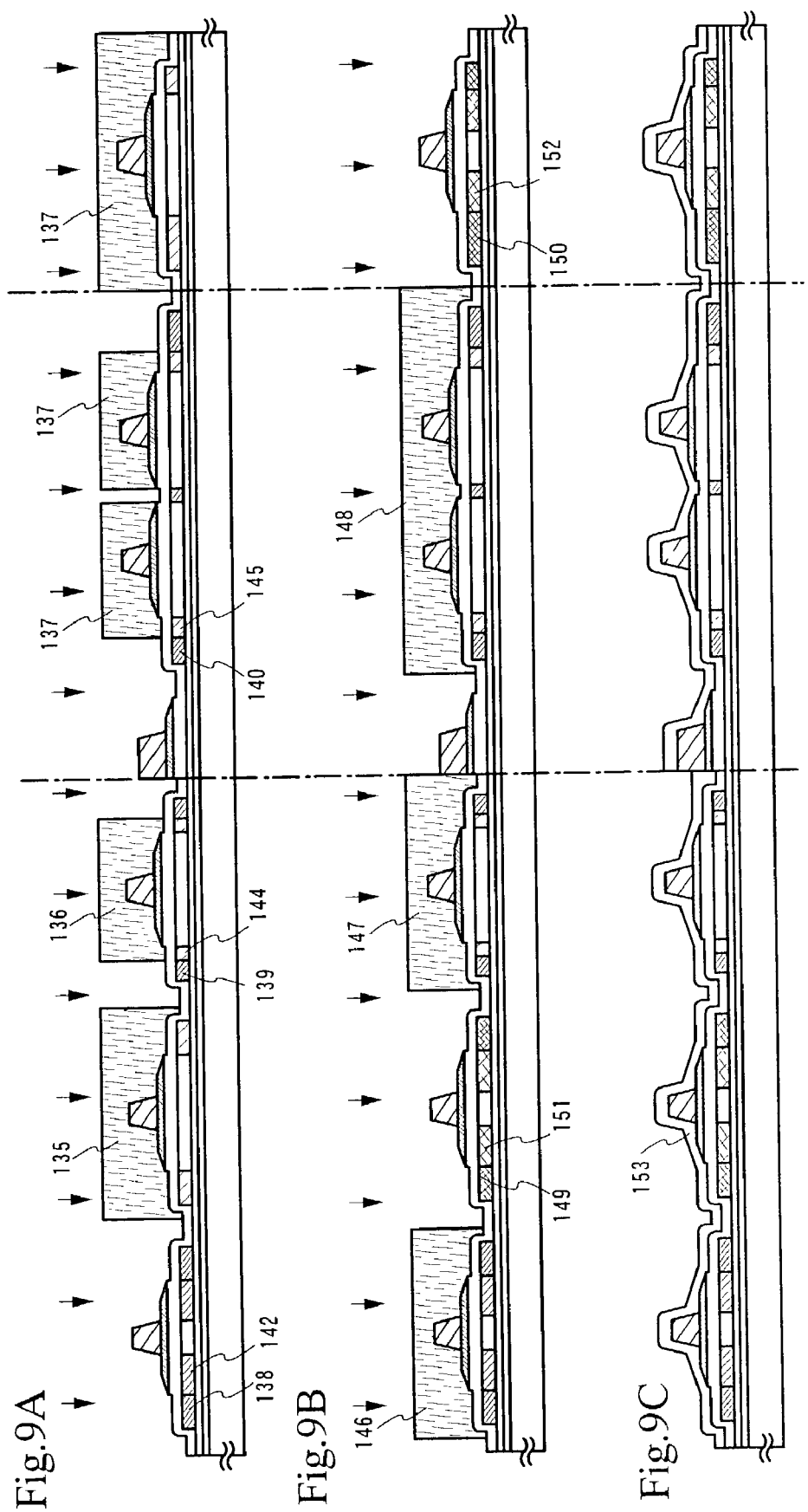

METHOD OF MANUFACTURING A SEMICONDUCTOR FILM BY PLASMA CVD USING A NOBLE GAS AND NITROGEN

BACKGROUND OF THE INVENTION

1. Field of the Invention

The present invention relates to a manufacturing method of a semiconductor film having an amorphous structure by using a plasma CVD method, in addition, to a semiconductor device which has circuits structured by thin film transistors (hereafter referred to as TFTs) using the semiconductor film, and to a method of manufacturing the semiconductor device. For example, the present invention relates to an electro-optical device, typically a liquid crystal display panel, and to electronic equipment in which this type of electro-optical device is installed as a part.

Note that, in the specification, the term, semiconductor devices, indicates a category of general devices which are capable of functioning by utilizing semiconductor characteristics, and electro-optical devices, semiconductor circuits, and electronic equipments are all included in the category of semiconductor devices.

2. Description of the Related Art

Thin film transistors (hereinafter referred to as TFTs) are known as typical semiconductor elements that use semiconductor films having a crystalline structure. TFTs are attracting attention as a technique of forming an integrated circuit on a glass or other insulating substrate, and devices utilizing TFTs, such as a liquid crystal display device with a built-in driving circuit, are beginning to appear on the market. In prior art, a semiconductor film with a crystalline structure is formed by using heat treatment or laser annealing to crystallize an amorphous semiconductor film that is obtained by deposition through plasma CVD or reduced pressure CVD. (Laser annealing is the technique of crystallizing a semiconductor film through irradiation of laser light.)

The thus formed semiconductor film with a crystalline structure is a mass of crystal grains. Since the crystal grains are randomly oriented and the orientation thereof cannot be controlled, the semiconductor film affects TFT characteristics. JP 07-183540 A discloses a technique to tackle this problem. The technique involves doping with a metallic element that accelerates crystallization of a semiconductor film, such as nickel, to form a semiconductor film having a crystalline structure. The technique can cause a large proportion of crystal grains to orient in the same direction, and can lower the heating temperature required for crystallization as well. When this semiconductor film having a crystalline structure is used in a TFT, the field effect mobility is improved and the sub-threshold coefficient (S value) is reduced to improve the electric characteristics of the TFT exponentially.

By using a metallic element for promoting crystallization, generation of nuclei in crystallization can be controlled. Therefore, film quality thus obtained is uniform in comparison with another crystallization method in which nuclei are generated at random, and ideally, it is desirable that metallic elements are completely removed or reduced to an allowable range. However, the metallic element added for accelerating crystallization remains in the semiconductor film having a crystalline structure, or on the surface thereof, causing problems such as fluctuation in characteristic of semiconductor elements obtained. For example, the remaining metallic element increases OFF current in the TFTs to cause fluctuation between the semiconductor elements. In short, the metallic element for accelerating crystallization becomes an unwanted presence once the semiconductor film having a crystalline structure is formed.

Gettering using phosphorus is actively employed as an effective method of removing a metallic element that accelerates crystallization from a specific region of a semiconductor film having a crystalline structure. For instance, the metallic element can readily be removed from a channel forming region by doping a source•drain region of a TFT with phosphorus and subjecting the film to heat treatment at 450 to 700° C.

Phosphorus is injected to the semiconductor film having a crystalline structure by ion doping (ion doping is a method of dissociating $PH_3$ or the like by plasma and accelerating the obtained ions in the electric field to inject the ions into a semiconductor, and basically does not include ion mass separation). For gettering, the concentration of phosphorus in the semiconductor film has to be $1 \times 10^{20}/cm^3$ or higher. Phosphorus doping by ion doping makes the semiconductor film having a crystalline structure amorphous, and an increased phosphorus concentration inhibits recrystallization during the subsequent annealing. In addition to this problem, high concentration phosphorus doping prolongs treatment time required for doping and lowers throughput in the doping step.

Furthermore, a source•drain region of a p-channel TFT which is doped with phosphorus needs boron in a concentration 1.5 to 3 times higher than the phosphorus concentration in order to reverse the conductivity type of the region. This makes the recrystallization difficult and raises the resistance of the source drain region undesirable.

Also, when sufficient gettering is not conducted in a substrate and a variation in gettering is caused, a slight difference, that is, a variation among respective TFT characteristics is caused. In the case of a transmission liquid crystal display device, when there is a variation in electrical characteristics of TFTs located in a pixel portion, a variation in a voltage applied to each pixel electrode is caused. Thus, a variation in the amount of light to be transmitted is caused. This results in uneven display which is reflected in an eye of an observer.

Also, for a light emitting device using an OLED, a TFT becomes all essential element to realize an active matrix drive method. Thus, at least, a TFT which serves as a switching element and a TFT for supplying a current to the OLED are provided to each pixel of the light emitting device using the OLED. The luminance of the pixel is determined based on all on current (Ion) of the TFT which is electrically connected with the OLED and supplies a current to the OLED regardless of a circuit configuration of the pixel and a drive method. Accordingly, for example, when entire white display is conducted, there is a problem in that a variation in luminance is caused if the on current is not kept constant.

SUMMARY OF THE INVENTION

The present invention has been made to solve these problems, and an object of the present invention is therefore to provide a technique of using a metallic element that accelerates crystallization of a semiconductor film to obtain a semiconductor film having a crystalline structure and then effectively removing the metallic element remaining in the film.

Gettering techniques are deemed as major techniques in integrated circuit manufacturing techniques using a single crystal silicon wafer. In gettering, metal impurities taken into a semiconductor segregate in a gettering site by some energy to reduce the impurity concentration in an active region of the semiconductor element. Gettering techniques are roughly divided into two; extrinsic gettering and intrinsic gettering. Extrinsic gettering provides a gettering effect by externally applied strain field or chemical actions. Phosphorus gettering, in which a high concentration of phosphorus is diffused from the back side of a single crystal silicon wafer, falls within the definition of extrinsic gettering. The gettering described in the above paragraph which uses phosphorus is also one of the extrinsic gettering techniques.

On the other hand, intrinsic gettering utilizes a strain field of a lattice defect caused by oxygen that is generated inside a single crystal silicon wafer. The present invention focuses attention on intrinsic gettering utilizing a lattice defect or lattice strain as such and, in order to apply intrinsic gettering to an approximately 10 to 100 nm thick semiconductor film having a crystalline structure, employs the following measures.

The present invention is comprised of: a step of using a metallic element for promoting crystallization of the semiconductor to form on an insulating surface a first semiconductor film that has a crystalline structure; a step of forming on the first semiconductor film a film that serves as an etching stopper (barrier layer); a step of forming on the barrier layer a second semiconductor film that contains a rare gas element and nitrogen (gettering site); a step of gettering to move the metallic element to the gettering site; and a step of removing the second semiconductor film.

According to the present invention, in the above step of forming the gettering site, a plasma CVD method is used, film formation is conducted using monosilane, a noble gas element, and nitrogen as raw gases to obtain a semiconductor film which includes the noble gas element at a high concentration and has an amorphous structure, typically, an amorphous silicon film. In addition, disilane or trisilane may be used instead of monosilane. Note that the plasma CVD method is used for cleaning the inner portion of a film formation room (which is also called a chamber) using gases. Thus, this is a film formation method in which maintenance is easy and which is suitable for mass production, as compared with a sputtering method.

According to the present invention related to a method of manufacturing a semiconductor film having an amorphous structure as disclosed in this specification, it is characterized in that monosilane, a noble gas, and nitrogen as raw gases are introduced into a film formation chamber and plasma is generated to form a semiconductor film which includes the noble gas element and nitrogen and has an amorphous structure on a surface to be formed.

Also, according to the above structure, it is characterized in that when the plasma is generated, a pressure in the film formation chamber is 2.666 Pa to 133.3 Pa.

Also, according to the above structure, it is characterized in that a flow rate proportion of nitrogen to the noble gas ($N_2$/noble gas) is controlled to be 0.2 to 5.

Also, according to the above structure, it is characterized in that an RF power density for generating the plasma is 0.0017 W/cm$^2$ to 1 W/cm$^2$. Note that, when an RF power density higher than 1 W/cm$^2$ is set, a film formation failure such that not a film but a powder is formed or a hemispherical float is produced on a film is easy to cause.

Also, according to the above structure, it is characterized in that monosilane, the noble gas element, and nitrogen are used as raw gases, a ratio (monosilane:noble gas) is controlled to be 0.1:99.9 to 1:9, preferably, 1:99 to 5:95 for film formation to form the semiconductor film which includes the noble gas element at a high concentration and has the amorphous structure, typically, the amorphous silicon film.

In addition, disilane or trisilane may be used instead of monosilane. It is preferable that a film formation temperature is 300° C. to 500° C.

FIG. 19 shows an experimental result in the case where monosilane (2 sccm in flow rate), argon (198 sccm in flow rate), and nitrogen (10 sccm in flow rate) are used as raw gases, a ratio (monosilane:noble gas) is controlled to be 1:99, an amorphous silicon film is formed in a film condition that a film formation temperature is 350° C., a film formation pressure is 6.665 Pa (0.05 Torr), and RF power is 50 W, and an intensity ratio of argon/silicon near the surface of the film is measured by a TXRF to obtain a concentration of argon.

Also, according to the above structure, it is characterized in that nitrogen having a concentration of $1 \times 10^{18}$/cm$^3$ to $1 \times 10^{22}$/cm$^3$ is included in the semiconductor film having the amorphous structure.

Also, according to the above structure, it is characterized in that the noble gas element having a concentration of $1 \times 10^{18}$/cm$^3$ to $1 \times 10^{22}$/cm$^3$, preferably, $1 \times 10^{20}$/cm$^3$ to $1 \times 10^{21}$/cm$^3$ is included in the semiconductor film having the amorphous structure.

The semiconductor film obtained by the above manufacturing method is a semiconductor film having an amorphous structure, which is characterized by including the noble gas element at a concentration of $1 \times 10^{18}$/cm$^3$ to $1 \times 10^{20}$/cm$^3$ and nitrogen at a concentration of $1 \times 10^{20}$/cm$^3$ to $1 \times 10^{21}$/cm$^3$.

Also, according to the present invention related to a method of manufacturing, a semiconductor device as disclosed in this specification, the method includes a first step of forming a first semiconductor film having an amorphous structure on an insulating surface, a second step of adding a metallic element to the first semiconductor film having the amorphous structure, a third step of crystallizing the first semiconductor film to form a first semiconductor film having a crystalline structure, a fourth step of forming a barrier layer on a surface of the first semiconductor film having the crystalline structure, a fifth step of forming a second semiconductor film including a noble gas element and nitrogen on the barrier layer, a sixth step of gettering the metallic element to the second semiconductor film to remove or reduce the metallic element in the first semiconductor film having the crystalline structure, and a seventh step of removing the second semiconductor film.

According to the above structure, it is characterized in that the second semiconductor film is formed by introducing monosilane, a noble gas element, and nitrogen as raw gases into a film formation chamber and then generating plasma, namely by a plasma CVD method.

Also, according to the above structure, the metallic element is a metallic element for promoting crystallization of silicon and one kind or plural kinds of elements selected from the group consisting of Fe, Ni, Co, Ru, Rh, Pd, Os, Ir, Pt, Cu, and Au.

Also, according to the above structure, the noble gas element is one kind or plural kinds of elements selected from the group consisting of He, Ne, Ar, Kr, and Xe.

(Experiment 1)

Here, concentrations of argon and nitrogen in an amorphous silicon film formed on a semiconductor substrate (silicon substrate) by a plasma CVD method using monosilane, an argon element, and nitrogen as raw gases are examined.

First, the semiconductor substrate is transferred into a chamber, heated, and kept at 300° C. A pressure in the chamber is controlled by an evacuation system to be 66.65 Pa (0.5 Torr). Next, while an $SiH_4$ gas is introduced from a gas introduction system into the chamber at a flow rate of 100 sccm and discharge is conducted at a discharge frequency of 27.12 MHz and applied RF power of 20 W (0.033 $W/cm^2$ in RF power density (600 $cm^2$ in electrode area)) by a high frequency power source, a first amorphous silicon film is formed by a plasma CVD method. Note that the first amorphous silicon film is a reference.

Next, a second amorphous silicon film having a film thickness of 200 nm is laminated on the first amorphous silicon film. The second amorphous silicon film is formed as follows. That is, after it is kept at 300° C., a pressure in the chamber is controlled by an evacuation system to be 5.332 Pa (0.04 Torr). Then, while an $SiH_4$ gas, an argon gas, and a nitrogen gas are introduced from the gas introduction system into the chamber at flow rates of 100 sccm 100 sccm, and 80 sccm, respectively and discharge is conducted at a discharge frequency of 27.12 MHz and applied RF power of 20 W (0.033 $W/cm^2$ in RF power density) by the high frequency power source, a plasma CVD method is used.

Next, a third amorphous silicon film having a film thickness of 200 nm is laminated on the second amorphous silicon film. The third amorphous silicon film is formed as follows. That is, after it is kept at 300° C., a pressure in the chamber is controlled by an evacuation system to be 4 Pa (0.03 Torr). Then, while an $SiH_4$ gas, an argon gas, and a nitrogen gas are introduced from the gas introduction system into the chamber at flow rates of 100 sccm, 50 sccm, and 40 sccm, respectively and discharge is produced at a discharge frequency of 27.12 MHz and applied RF power of 20 W (0.033 $W/cm^2$ in RF power density) by the high frequency power source, a plasma CVD method is used.

Next, a fourth amorphous silicon film having a film thickness of 200 nm is laminated on the third amorphous silicon film. The fourth amorphous silicon film is formed as follows. That is, after it is kept at 300° C., a pressure in the chamber is controlled by an evacuation system to be 2.666 Pa (0.02 Torr). Then, while an $SiH_4$ gas, an argon gas. and a nitrogen gas are introduced from the gas introduction system into the chamber at flow rates of 50 sccm, 25 sccm, and 20 sccm, respectively and discharge is produced at a discharge frequency of 27.12 MHz and applied RF power of 20 W (0.033 $W/cm^2$ in RF power density) by the high frequency power source, a plasma CVD method is used, to complete the first amorphous silicon film with the thickness of 200 nm on the semiconductor substrate.

Next, a fifth amorphous silicon film having a film thickness of 200 nm is laminated on the third amorphous silicon film. The fifth amorphous silicon film is formed under the same condition as that of the first amorphous silicon film.

Thus, an SIMS analysis is conducted for the laminate film obtained on the semiconductor substrate. FIG. 2A shows a result obtained by measuring a concentration of argon in the film, FIG. 2B shows a result obtained by measuring a concentration of fluorine, FIG. 3A shows a result obtained by measuring a concentration of nitrogen, and FIG. 3B shows a result obtained by measuring a concentration of oxygen. From FIG. 2B, it can be read that the concentration of fluorine in the film is about $8 \times 10^{17}/cm^3$ to $2 \times 10^{18}/cm^3$. In addition, from FIG. 3B, it can be read that the concentration of oxygen in the film is about $4 \times 10^{17}/cm^3$ to $3 \times 10^{18}/cm^3$. Further, although not shown, the concentration of carbon in the film is $1 \times 10^{16}/cm^3$ to $5 \times 10^{17}/cm^3$.

As is apparent from FIGS. 2A and 2B and 3A and 3B, when nitrogen, argon, and a monosilane gas are used as raw gases, the concentration of argon in the amorphous silicon film is increased up to $1 \times 10^{20}/cm^3$ to $1 \times 10^{21}/cm^3$. Thus, the amorphous silicon film including argon can be formed at a high concentration, specifically, a concentration of $1 \times 10^{20}/cm^3$ to $1 \times 10^{21}/cm^3$ by a plasma CVD method using nitrogen, argon, and a monosilane gas as raw gases. To contrast to this, when an argon gas and a monosilane gas are used as raw gases, argon in the film can be included at only a concentration of up to about $1 \times 10^{18}/cm^3$, that is, $5 \times 10^{17}/cm^3$ to $2 \times 10^{18}/cm^3$.

Also, when nitrogen, argon, and a monosilane gas are used as raw gases, the concentration of nitrogen in the amorphous silicon film is increased up to $1 \times 10^{20}/cm^3$ to $1 \times 10^{21}/cm^3$. Nitrogen and argon are relatively inert gases and low-cost gasses. Thus, those are easy to industrially use.

(Experiment 2)

Next, when a plasma CVD method is used and a condition of an RF power density is changed, the dependence of RF power densities to the concentrations of argon and nitrogen in an amorphous silicon film is examined.

First, a first amorphous silicon film as a reference is formed on a semiconductor substrate by a plasma CVD method in the same condition as Experiment 1.

Next, a second amorphous silicon film having a film thickness of 200 nm is laminated on the first amorphous silicon film. The second amorphous silicon film is formed as follows. That is, after it is kept at 300° C., a pressure in the chamber is controlled by an evacuation system to be 26.66 Pa (0.2 Torr). Then, while an $SiH_4$ gas, an argon gas, and a nitrogen gas are introduced from the gas introduction system into the chamber at flow rates of 100 sccm, 500 sccm, and 200 sccm, respectively and discharge is produced at a discharge frequency of 27.12 MHz and applied RF power of 20 W (0.033 $W/cm^2$ in RF power density) by the high frequency power source, a plasma CVD method is used.

Next, a condition of only applied RF power is changed and a third amorphous silicon film (0.166 $W/cm^2$ in RF power density), a fourth amorphous silicon film (0.333 $W/cm^2$ in RF power density), and a fifth amorphous silicon film (0.5 $W/cm^2$ in RF power density), are laminated in order on the second amorphous silicon film.

Thus, an SIMS analysis is conducted for the laminate film obtained on the semiconductor substrate. FIG. 4A shows a result obtained by measuring a concentration of argon in the film, FIG. 4B shows a result obtained by measuring a concentration of fluorine, FIG. 5A shows a result obtained by measuring a concentration of nitrogen, and FIG. 5B shows a result obtained by measuring a concentration of oxygen. The concentration of carbon is $1 \times 10^{16}/cm^3$ to $5 \times 10^{17}/cm^3$.

As is apparent from FIGS. 4A and 4B and 5A and 5B, the concentration of argon in the amorphous silicon film is increased with increasing the RF power density. Note that, even when the RF power density is increased, it does not almost appear that the concentrations of fluorine, nitrogen, oxygen, and carbon in the film are changed.

(Experiment 3)

Next, when a plasma CVD method is used and a condition of a pressure in the chamber is changed, the dependence of the pressure in the chamber to the concentrations of argon and nitrogen in an amorphous silicon film is examined.

First, a first amorphous silicon film as a reference is formed on a semiconductor substrate by a plasma CVD method under the same condition as Experiment 1.

Next, a second amorphous silicon film having a film thickness of 200 nm is laminated on the first amorphous silicon film. The second amorphous silicon film is formed as follows. That is, after it is kept at 300° C., a pressure in the chamber is controlled by an evacuation system to be 6.666 Pa (0.05 Torr). Then, while an $SiH_4$ gas, an argon gas, and a nitrogen gas are introduced from the gas introduction system into the chamber at flow rates of 50 sccm, 25 sccm, and 20 sccm, respectively and discharge is produced at a discharge frequency of 27.12 MHz and applied RF power of 300 W (0.5 $W/cm^2$ in RF power density) by the high frequency power source, a plasma CVD method is used.

Next, a condition only of a pressure in the camber is changed and a third amorphous silicon film (pressure: 5.332 Pa (0.04 Torr)), a fourth amorphous silicon film (4 Pa (0.03 Torr)), and a fifth amorphous silicon film (pressure: 2.666 Pa (0.02 Torr)), are laminated in order on the second amorphous silicon film.

Thus, an SIMS analysis is conducted for the laminate film obtained on the semiconductor substrate. FIG. 6A shows a result obtained by measuring a concentration of argon in the film, FIG. 6B shows a result obtained by measuring a concentration of fluorine, FIG. 7A shows a result obtained by measuring a concentration of nitrogen, and FIG. 7B shows a result obtained by measuring a concentration of oxygen. The concentration of carbon is $1 \times 10^{16}/cm^3$ to $5 \times 10^{17}/cm^3$.

As is apparent from FIGS. 6A to 7B, the concentration of argon in the amorphous silicon film is increased as the pressure is reduced, i.e., the high vacuum is attained. Note that, even when the pressure is reduced, it does not almost appear that the concentrations of fluorine, nitrogen, oxygen, and carbon in the film are changed.

(Experiment 4)

Here, a film quality of an amorphous silicon film formed by a plasma CVD method using monosilane, an argon element, and nitrogen as raw gases will be described below.

FIG. 18 shows spectral data obtained by conducting a Fourier transform infrared spectroscopy (FT-IR method) for an amorphous silicon film formed using monosilane, an argon element, and nitrogen as row gases. A peak of Si—Si bonding at 656/cm, a peak of Si—N bonding at 852/cm, and a peak at 2030/cm appear in FIG. 18. It is assumed that a weave number of 2000/cm corresponds to the peak of Si—H bonding and a wave number of 2100/cm corresponds to the peak of Si—$H_2$ bonding. Thus, it is said that the peak at the wave number of 2030/cm as shown in FIG. 18 is produced because it indicates mainly Si—H bonding and slightly Si—$H_2$ bonding. In addition, this film is characterized in that a peak due to N—H bonding does not appear and the refractive index is 3.0 to 4.0.

BRIEF DESCRIPTION OF THE DRAWINGS

In the accompanying drawings:

FIGS. 8A to 8D show steps of manufacturing an AM-LCD;

FIGS. 9A to 9C show steps of manufacturing the AM-LCD;

DETAILED DESCRIPTION OF THE PREFERRED EMBODIMENTS

Embodiment modes of the present invention will be described below.

(Embodiment Mode 1)

Hereinafter, an order of manufacturing a typical TFT by the present invention will be briefly described using FIGS. 1A to 1G. Here, an example in which a semiconductor film which includes a noble gas element and nitrogen and has an amorphous structure according to the present invention is used as a gettering site is indicated.

Figure 1A:
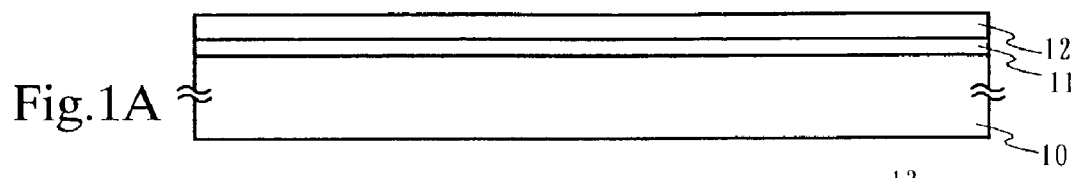
FIGS. 1A to 1G show steps of manufacturing a TFT.

In FIG. 1A, reference numeral 10 denotes a substrate having all insulating surface, 11 denotes an insulating film as a blocking layer, and 12 denotes a semiconductor film having an amorphous structure.

In FIG. 1A, a glass substrate, a quartz substrate, a ceramic substrate or the like may be used as the substrate 10. In addition, a silicon substrate, a metallic substrate, or a stainless substrate, in which an insulating film is formed on the surface may be used. Further, a plastic substrate having a heat resistance, which can withstand a processing temperature in the present steps may be used.

First, as shown in FIG. 1A, a base insulating film 11 as an insulating film such as a silicon oxide film, a silicon nitride film, or a silicon oxynitride film ($SiO_xN_y$) is formed on the substrate 10. As a typical example, the base insulating film 11 is composed of a two-layered structure and a structure in which a first silicon oxynitride film to be formed at a thickness of 50 nm to 100 nm using $SiH_4$, $NH_3$, and $N_2O$ as reactive gases and a second silicon oxynitride film to be formed at a thickness of 100 nm to 150 nm using $SiH_4$ and $N_2O$ as reactive gases are laminated is used therefor. It is preferable that a silicon nitride film (SiN film) having a film thickness of 10 nm or less or the second silicon oxynitride film ($SiN_xO_y$ film (X>>Y)) is used as one layer of the base insulating film 11. In gettering, nickel tends to move to a region having a high oxygen concentration. Thus, it is extremely effective that a silicon nitride film is used as the base insulating film which is in contact with a semiconductor film. In addition, a three-layered structure in which the first silicon oxynitride film, the second silicon oxynitride film, and the silicon nitride film are laminated in order may be used.

Next, a first semiconductor film 12 having an amorphous structure is formed on the base insulating film. A semiconductor material containing mainly silicon is used for the first semiconductor film 12. Typically, an amorphous silicon film, an amorphous silicon germanium film, or the like is applied and formed at a thickness of 10 nm to 100 nm by a plasma CVD method, a low pressure CVD method, or a sputtering method. In order to obtain a semiconductor film having a good quality crystalline structure by later crystallization, it is preferable that concentrations of impurities such as oxygen and nitrogen which are included in the first semiconductor film 12 having the amorphous structure are reduced to $5\times10^{18}/cm^3$ (atomic concentration measured by a secondary ion mass spectroscopy (SIMS)) or lower. These impurities become a factor for hindering later crystallization and a factor for increasing densities of trapping center and recombination center even after the crystallization. Thus, it is desirable that a high purity material gas is naturally used and a ultra high vacuum support CVD apparatus in which mirror processing (electropolishing processing) is performed for a reactive chamber and which includes a vacuum evacuation system of oil free is used.

Figure 1B:
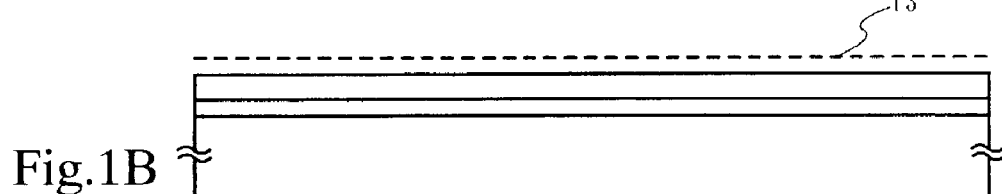

Next, the first semiconductor film 12 having the amorphous structure is crystallized by using a crystallization technique described in JP 08-78329 A here. According to the technique described in this document, a metallic element for promoting crystallization is selectively added to an amorphous silicon film and thermal treatment is performed to form the semiconductor film having a crystalline structure, which expands from an added region as a staring point. First, a nickel acetate solution including a metallic element (here, nickel) having catalysis for promoting crystallization at 1 ppm to 100 ppm in weight conversion is applied onto the surface of the first semiconductor film 12 having an amorphous structure by a spinner to form a nickel contained layer 13 (FIG. 1B). Means for forming an extremely thin film by a sputtering method, an evaporation method, or plasma processing may be used as another means except the method of forming the nickel contained layer 13 by the application. Also, an example in the case where the solution is applied onto the entire surface is indicated here. However, the nickel contained layer may be selectively formed by forming a mask.

Figure 1C:
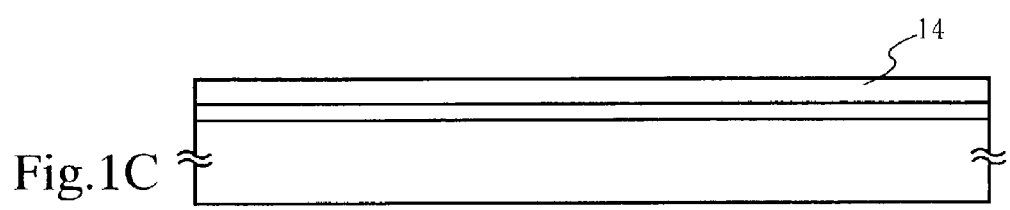

Next, thermal treatment is performed for crystallization. In this case, silicide is formed in a region of the semiconductor film which is in contact with the metallic element for promoting crystallization of a semiconductor and crystallization is progressed from the region as a nucleus. Thus, a first semiconductor film 14 having a crystalline structure as shown in FIG. 1C is formed. Note that it is desirable that a concentration of oxygen included in the first semiconductor film 14 after the crystallization is $5\times10^{18}/cm^3$ or lower. Here, thermal treatment for dehydrogenation (at 450° C. for 1 hour) is performed and then thermal treatment for crystallization (at 550° C. to 650° C. for 4 hours to 24 hours) is performed. In addition, when crystallization is conducted by intense light irradiation, infrared light, visible light, ultraviolet light, or a combination thereof can be used. Typically, light emitted from a halogen lamp, a metal halide lamp, a xenon arc lamp, a carbon arc lamp, a high pressure sodium lamp, or a high pressure mercury lamp is used. A lamp light source is turned on for 1 second to 60 seconds, preferably, 30 seconds to 60 seconds. This operation is preferably repeated one time to ten times so that the semiconductor film is instantaneously heated up to about 600° C. to 1000° C. Note that, if necessary, thermal treatment for releasing hydrogen included in the first semiconductor film 14 having the amorphous structure may be performed before the intense light irradiation. In addition, the thermal treatment and the intense light irradiation may be simultaneously performed for crystallization. When productivity is considered, it is desirable that the crystallization is conducted by the intense light irradiation.

A metallic element (here, nickel) is left in the thus obtained first semiconductor film 14. The metallic elements are not uniformly distributed in the film. However, they are left at a concentration higher than $1\times10^{19}/cm^3$ as an average concentration. Of course, even in such a state, various semiconductor devices including a TFT can be formed. Here, the metallic element is removed by the following method.

Next, in order to increase a crystallization ratio (ratio of a crystal element to a total volume of the film) and to repair a defect left in a crystal grain, laser light is preferably irradiated to the first semiconductor film 14 having the crystalline structure. At the laser light irradiation, a thin oxide film (not shown) is formed on the surface of the first semiconductor film. As this laser light, excimer laser light having a wavelength of 400 nm or less, or the second harmonic wave or the third harmonic wave of a YAG laser is used. In addition, a continuous oscillation laser (YAG laser, $YVO_4$ laser, YLF laser, $YAlO_3$ laser, glass laser, ruby laser, an alexandrite laser, or Ti:sapphire laser) may be used and a second harmonic wave to a fourth harmonic wave of the fundamental wave may be applied. Typically, a second harmonic wave (532 nm) or a third harmonic wave (355 nm) of an Nd:$YVO_4$ laser (fundamental wave of 1064 nm) is preferably applied. When the continuous oscillation laser is used, laser light emitted from a continuous oscillation $YVO_4$ laser having an output of 10 W is converted into a harmonic wave by a non-linear optical clement. In addition, there is a method of emitting a harmonic wave by locating a $YVO_4$ crystal and a non-linear optical element in a resonator. Preferably, laser light having a rectangular shape or an elliptical shape is formed on an irradiation surface by an optical system and irradiated to an object to be processed. Note that the shape of the laser light (laser spot) on the irradiation surface is made to be an elliptical shape in which a length of a short diameter is 3 μm to 100 μm and that of a long diameter is 100 μm or more by a beam forming means composed of the optical system. Instead of the elliptical shape, a rectangular shape in which a length of a short side is 3 μm to 100 μm and that of a long side is 100 μm or more may be used. When the rectangular shape or the elliptical shape is used, laser anneal can be efficiently performed for the entire surface of the substrate. Here, the reason why the length of the long diameter (or long side) is set to be 100 μm or more is as follows. That is, if the laser light has an energy density suitable for the laser anneal, the length of the long diameter (or long side) is desirably determined as appropriate by an executor. At this time, an energy density of about 0.01 MW/cm$^2$ to 100 MW/cm$^2$ (preferably, 0.1 MW/cm$^2$ to 10 MW/cm$^2$) is required. It is preferable that the semiconductor film is moved relatively to the laser light at a speed of about 10 cm/s to 2000 cm/s and irradiated with it.

Figure 1D:
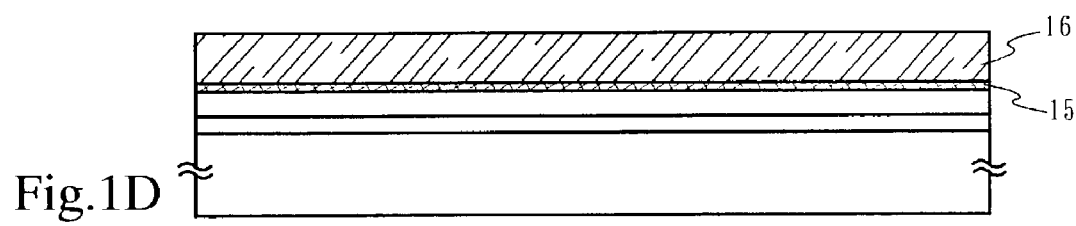

The oxide film formed by the laser light irradiation after the above crystallization is insufficient. Thus, another oxide film (called a chemical oxide) is formed by an aqueous solution containing ozone (typically, ozone water) to obtain a barrier layer 15 made from the oxide film having a total thickness of 1 nm to 10 nm. A second semiconductor film 16 including a noble gas element is formed on the barrier layer 15 (FIG. 1D). Note that, it is assumed here that an oxide film formed when laser light is irradiated to the first semiconductor film 14 having the crystalline structure is a portion of the barrier layer 15. The barrier layer 15 serves as an etching stopper in the case where only a second semiconductor film 16 is selectively removed in a later step. Also, even when processing is performed using an aqueous solution in which a hydrogen peroxide solution is mixed with sulfuric acid, hydrochloric acid, nitric acid, or the like instead of the aqueous solution containing ozone, a chemical oxide can be formed as in the above case. According to another method of forming the barrier layer 15, ultraviolet light irradiation is performed in an oxygen atmosphere to generate ozone so that the surface of the semiconductor film having the crystalline structure may be oxidized to form the barrier layer. In addition, according to another method of forming the barrier layer 15, an oxide film having a thickness of about 1 nm to 10 nm may be deposited by a plasma CVD method, a sputtering method, an evaporation method, or the like to be the barrier layer. When a plasma CVD method, a sputtering method, an evaporation method, or the like is used for forming the barrier layer, it is desirable that the barrier layer is formed after the surface of the semiconductor film having the crystalline structure is washed to remove a natural oxide film, an oxide film formed by the laser light irradiation, and the like.

Also, when a plasma CVD method is used for forming the barrier layer, a silane based gas (monosilane, disilane, trisilane, or the like) and a nitrogen oxide based gas (gas represented by NOx) are used as raw gases and pulse oscillation is conducted for film formation. For example, as raw gases, monosilane (SiH$_4$) and nitrous oxide (N$_2$O), a TEOS gas and N$_2$O, or a TEOS gas, N$_2$O, and O$_2$ are used and a silicon oxynitride film having a thickness of 10 nm or less, preferably, 5 nm or less is formed. As compared with the oxide film (called a chemical oxide) obtained from an aqueous solution containing ozone (typically, ozone water) and the oxide film obtained by conducting ultraviolet light irradiation in an oxygen atmosphere to generate ozone so that the surface of the semiconductor film having the crystalline structure is oxidized, the silicon oxynitride film has a high contact property to the first semiconductor film having the crystalline structure and peeling is not caused in a later step (formation of the second semiconductor film). In order to further improve the contact property, argon plasma processing may be performed before the formation of the barrier layer. In addition, even in a step of gettering, when the silicon oxynitride film is formed in the above film thickness range, the metallic element can be transmitted through the barrier layer and moved to a gettering site.

Also, when a plasma CVD method is used for forming the barrier layer, the second semiconductor film including a noble gas element and the barrier layer can be formed without exposing them to air. In addition, they can be formed in the same chamber in succession. Thus, a superior throughput is obtained.

Also, according to another method of forming the barrier layer 15, a thin oxide film may be formed by heating at about 200° C. to 350° C. using a clean oven. Note that, it is required that the barrier layer 15 formed by any one of the above methods or a combination thereof has a film quality or a film thickness such that nickel in the first semiconductor film can be moved to the second semiconductor film by later gettering. In this specification, the barrier layer indicates a layer which has a film quality or a film thickness such that the transmission of the metallic element is possible in a gettering step and is used as an etching stopper in a step of removing a layer as a gettering site.

Here, the second semiconductor film 16 including the noble gas element and nitrogen is formed by a plasma CVD method to produce a gettering site. One kind or plural kinds of elements selected from the group consisting of helium (He), neon (Ne), argon (Ar), krypton (Kr), and xenon (Xe) are used as noble gas elements. Among them, argon (Ar) is preferable because of a low cost gas. Here, monosilane, argon, and nitrogen are used as raw gases. Thus, the second semiconductor film which includes argon at a concentration of $1\times10^{18}$/cm$^3$ to $1\times10^{22}$/cm$^3$, preferably, $1\times10^{20}$/cm$^3$ to $1\times10^{21}$/cm$^3$ and in which the gettering effect is obtained, can be formed by the plasma CVD method. Note that the second semiconductor film includes nitrogen at a concentration of $1\times10^{20}$/cm$^3$ to $1\times10^{21}$/cm$^3$ in addition to argon.

There are two meanings to include the noble gas element ion as an inert gas in the film. One is to form a dangling bond to cause a distortion in the semiconductor film. The other is to cause a distortion between lattices of the semiconductor film. When an element such as argon (Ar), krypton (Kr), xenon (Xe), which has a larger atomic radius than silicon is used, a distortion between lattices of the semiconductor film is remarkably caused. In addition, when the noble gas element is included in the film, not only a lattice distortion but also a dangling bond are produced to contribute to the improvement of a gettering action.

Figure 1E:
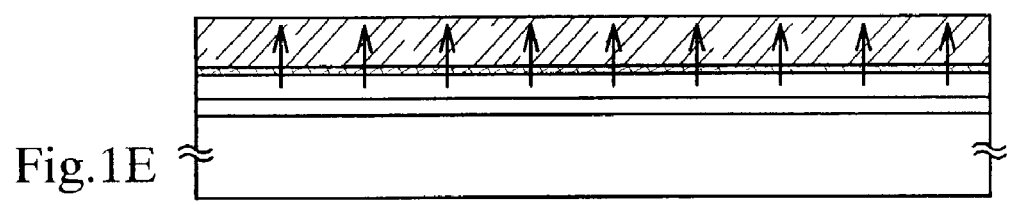

Next, thermal treatment is performed for gettering to reduce the concentration of the metallic element (nickel) or remove the metallic element in the first semiconductor film (FIG. 1E). Processing for irradiating intense light or thermal treatment is preferably performed as thermal treatment for gettering. By the gettering, the metallic element is moved in a direction indicated by an arrow in FIG. 1E (that is, a direction from a substrate side toward the surface of the second semiconductor film). Thus, the metallic element included in the first semiconductor film 16 covered with the barrier layer 15 is removed or the concentration thereof is reduced. It is preferable that a moving distance of the metallic element in gettering is at least a distance corresponding to the thickness of the first semiconductor film. Thus, gettering can be completed in a relatively short time. Here, the following sufficient gettering is conducted. Every nickel is moved to the second semiconductor film 19 so is not to segregate it in the first semiconductor film 16 so that nickel is not almost included in the first semiconductor film 16. That is, a concentration of nickel in the film is made to be $1\times10^{18}$/cm$^3$ or lower, desirably, $1\times10^{17}$/cm$^3$ or lower.

Note that there is a case where a portion of the second semiconductor film is crystallized dependent on a condition of thermal treatment for gettering or a film thickness of the second semiconductor film. If the second semiconductor film is crystallized, a dangling bond or a lattice distortion is decreased to cause a reduction in a gettering effect. Thus, a condition of thermal treatment in which the second semiconductor film is not crystallized or the film thickness of the second semiconductor film is preferably set. In either case, the second semiconductor film, that is, an amorphous silicon film including the noble gas element is hard to crystallize as compared with an amorphous silicon film which does not include the noble gas element. Thus, it is suitable as the gettering site. Further, the second semiconductor film includes nitrogen at a concentration of $1\times10^{20}/cm^3$ to $1\times10^{21}/cm^3$ so that it is harder to crystallize. Thus, it is preferable as the gettering site.

Also, dependent on the condition of thermal treatment for the gettering, an increase in a crystallization ratio of the first semiconductor film, and a repair of a defect left in a crystal grain, that is, the improvement of crystallinity can be made simultaneously with gettering.

Gettering in this specification indicates that a metallic element present in a region to be gettered (here, the first semiconductor film) is released by thermal energy and moved to the gettering site by diffusion. Thus, gettering depends on a processing temperature and is conducted for a shorter time with increasing a temperature.

When processing for irradiating intense light is used, a lamp light source for heating is turned on for 1 second to 60 seconds, preferably, 30 seconds to 60 seconds. This operation is repeated one time to ten times, preferably two times to six times. A light emission intensity of the lamp light source is arbitrarily set. However, the intensity is set such that the semiconductor film is instantaneously heated at about 600° C. to 1000° C., preferably, about 700° C. to 750° C.

Also, when gettering is conducted by thermal treatment, thermal treatment is preferably performed in a nitrogen atmosphere at 450° C. to 800° C. for 1 hour to 24 hours, for example, at 550° C. for 14 hours. Intense light irradiation may be performed in addition to the thermal treatment.

Figure 1F:
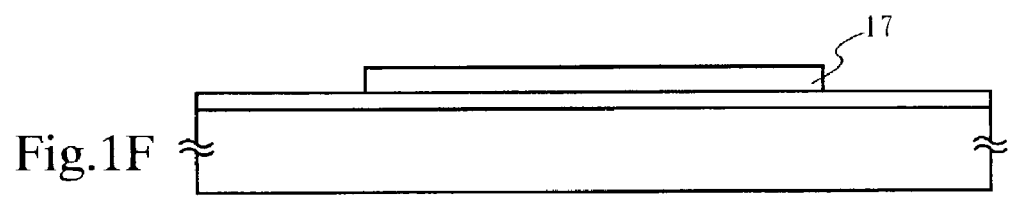

Next, only the second semiconductor film indicated by reference numeral 16 is selectively removed using the barrier layer 15 as an etching stopper. After that, the barrier layer 15 is removed and the first semiconductor film 16 is patterned by a known patterning technique to form a semiconductor layer 17 having a predetermined shape (FIG. 1F). As a method of selectively etching only the second semiconductor film, dry etching using $ClF_3$ without generating plasma or wet etching using an alkali solution such as an aqueous solution including hydrazine or tetraethyl ammonium hydroxide (chemical formula $(CH_3)_4NOH$) call be used. In addition, when a concentration of nickel in the surface of the barrier layer is measured by a TXRF after the removal of the second semiconductor film, nickel is detected bit a high concentration. Thus, it is preferable that the barrier layer is removed by an etchant including hydrofluoric acid. In addition, after the removal of the barrier layer, it is desirable that a thin oxide film is formed on the surface using ozone water before a mask made of a resist is formed.

Next, the surface of the semiconductor layer is washed by all etchant including hydrofluoric acid and then an insulating film including mainly silicon is formed as a gate insulating film 18. It is desirable that the surface washing and the formation of the gate insulating film are performed in succession without exposing to air.

Next, the surface of the gate insulating film 18 is washed and then a gate electrode 19 is formed. After that, an impurity element for imparting an n-type (P, As, or the like), here, phosphorus is suitably added to the semiconductor to form a source region 20 and a drain region 21. After the addition, thermal treatment, intense light irradiation, or laser light irradiation is performed to activate the impurity element. A plasma damage to the gate insulating film and a plasma damage to an interface between the gate insulating film and the semiconductor layer can be recovered simultaneously with the activation. In particular, it is very effective that the second harmonic wave of a YAG laser is irradiated from the front surface or the rear surface in an atmosphere of a room temperature to 300° C. to activate the impurity element. The YAG laser is easy to maintain. Thus, it is a preferable activation means.

Hereinafter, an interlayer insulating film 23 is formed, hydrogenation is performed, contact holes which reach the source region and the drain region are formed, and a source electrode 24 and a drain electrode 25 are formed. Thus, a TFT (n-channel TFT) is completed (FIG. 1G).

A concentration of the metallic element included in a channel forming region 22 in the thus obtained TFT can be set to be lower than $1\times10^{17}/cm^3$.

Figure 1G:
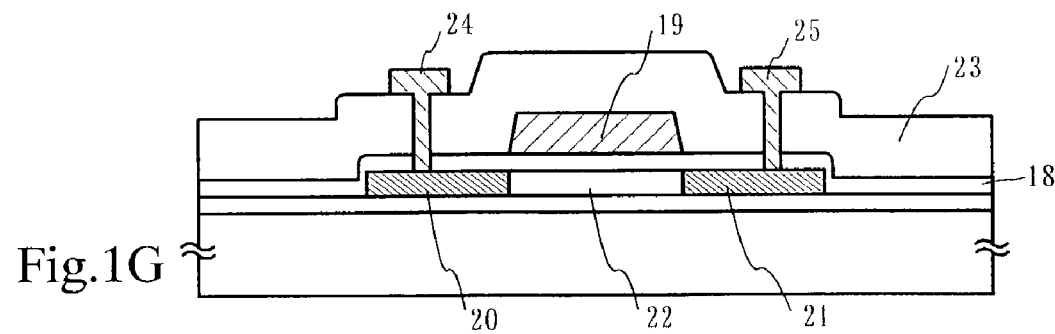
Figure 2A:
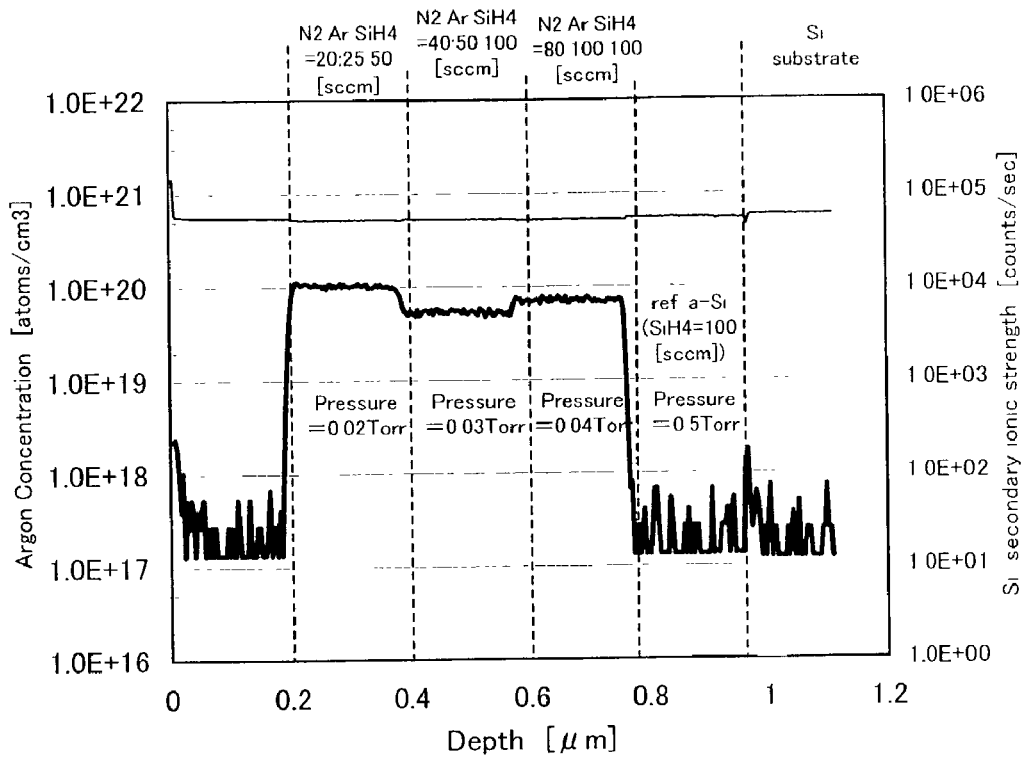
FIG. 2A is a graph indicating SIMS data related to a concentration of argon and FIG. 2B is a graph indicating SIMS data related to a concentration of fluorine (Experiment 1)
Figure 2B:
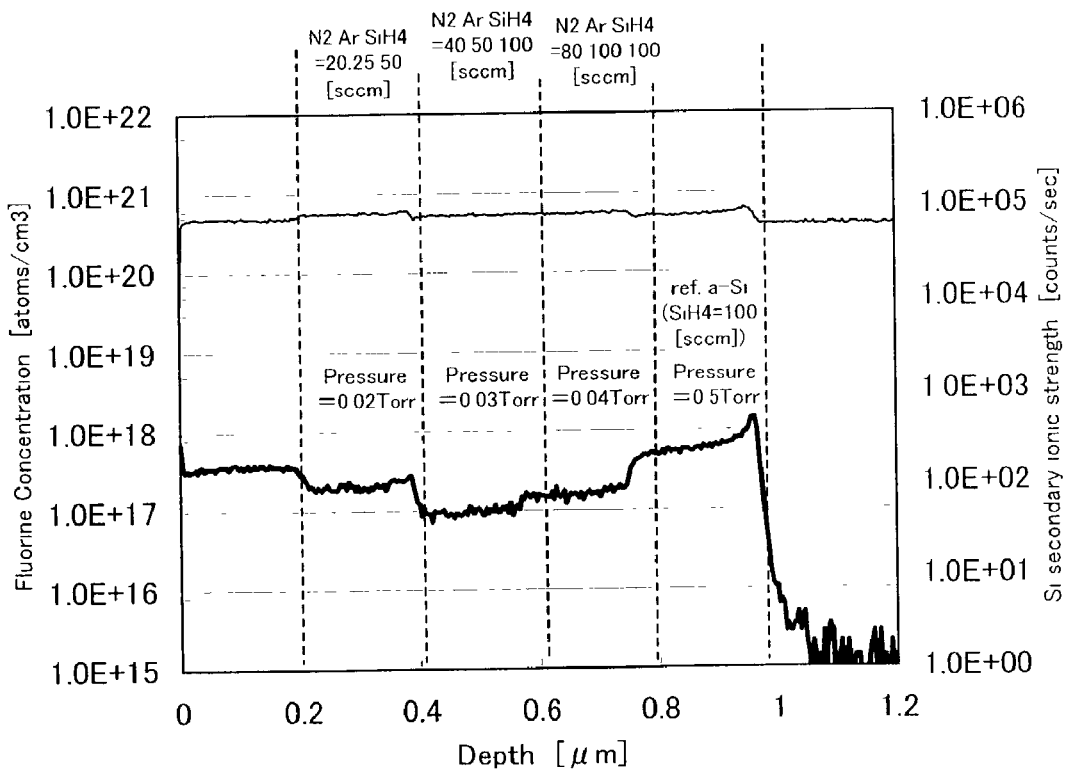
Figure 3A:
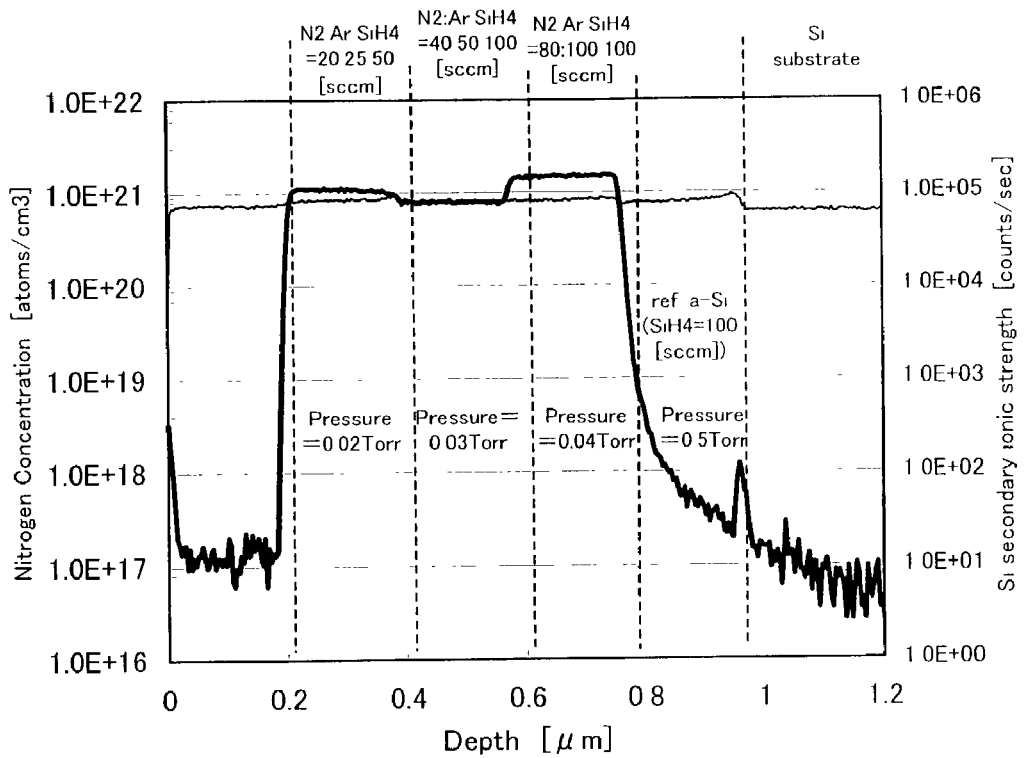
FIG. 3A is a graph indicating SIMS data related to a concentration of nitrogen and FIG. 3B is a graph indicating SIMS data related to a concentration of oxygen (Experiment 1)
Figure 3B:
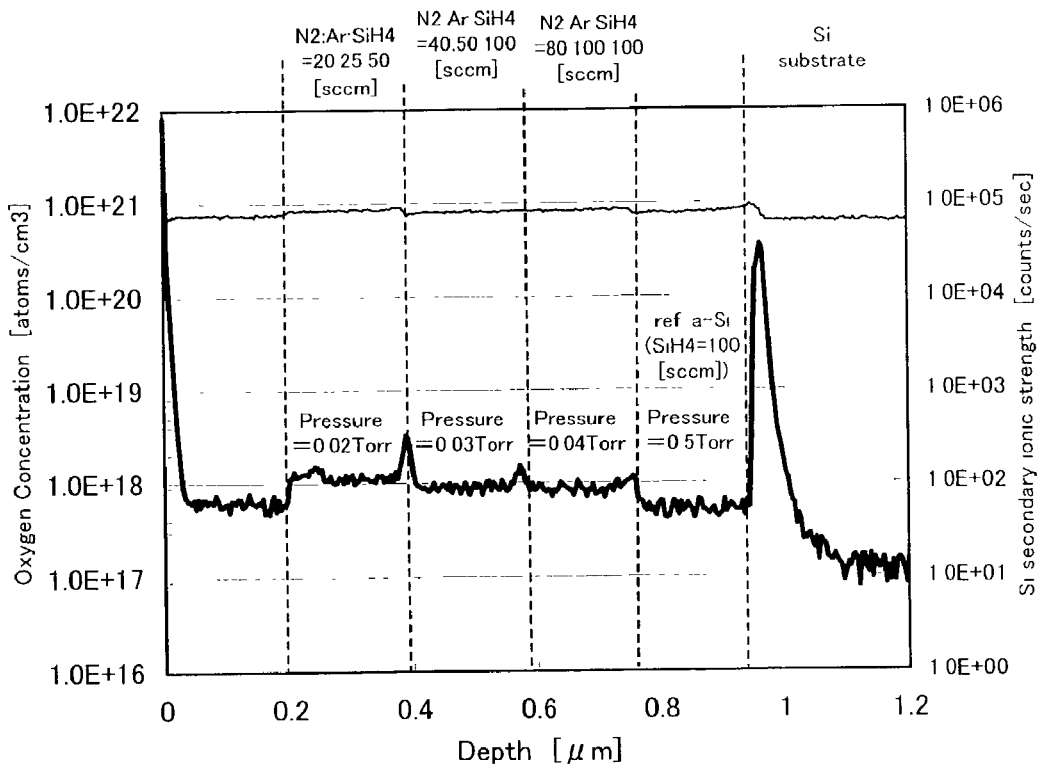
Figure 4A:
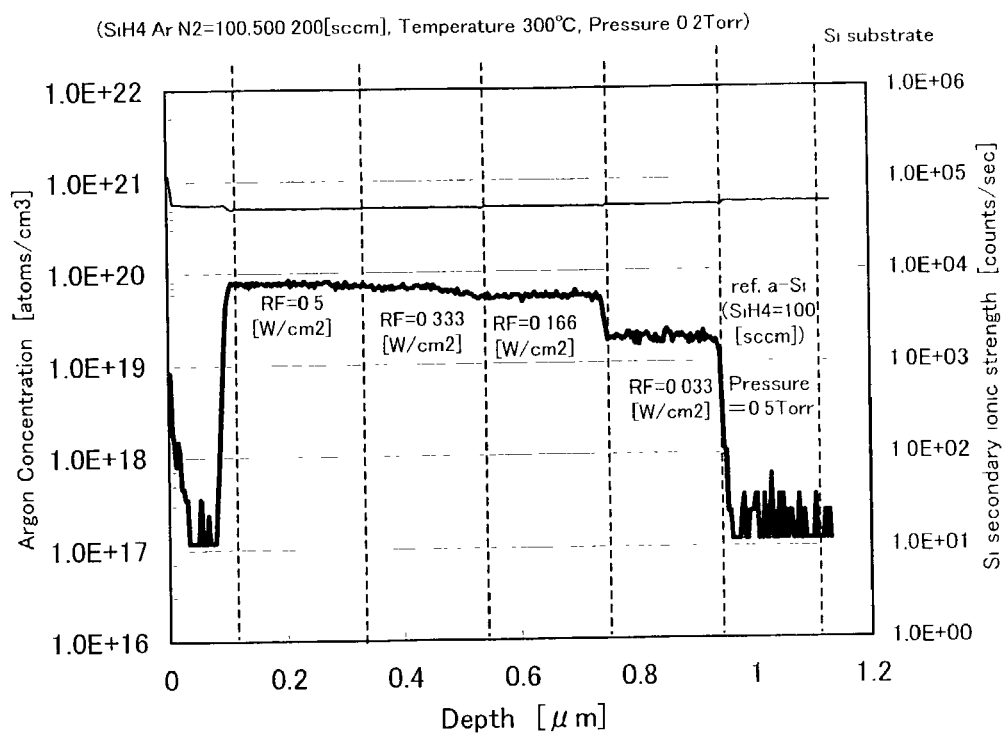
FIG. 4A is a graph indicating SIMS data related to a concentration of argon and FIG. 4B is a graph indicating SIMS data related to a concentration of fluorine (RF power dependence) (Experiment 2)
Figure 4B:
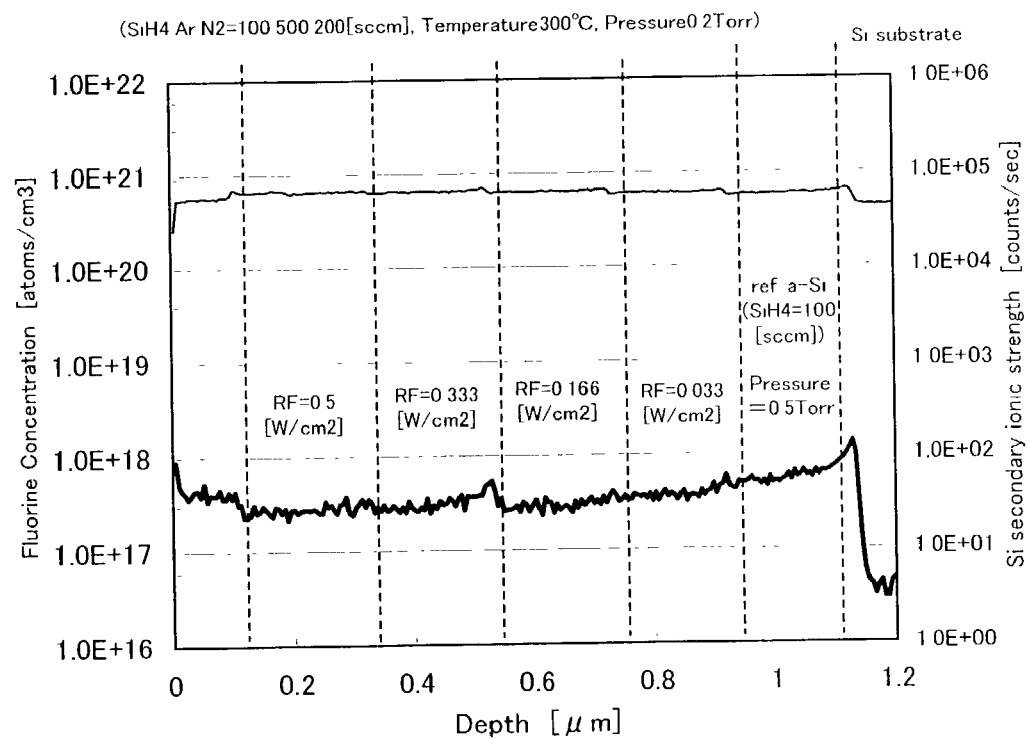
Figure 5A:
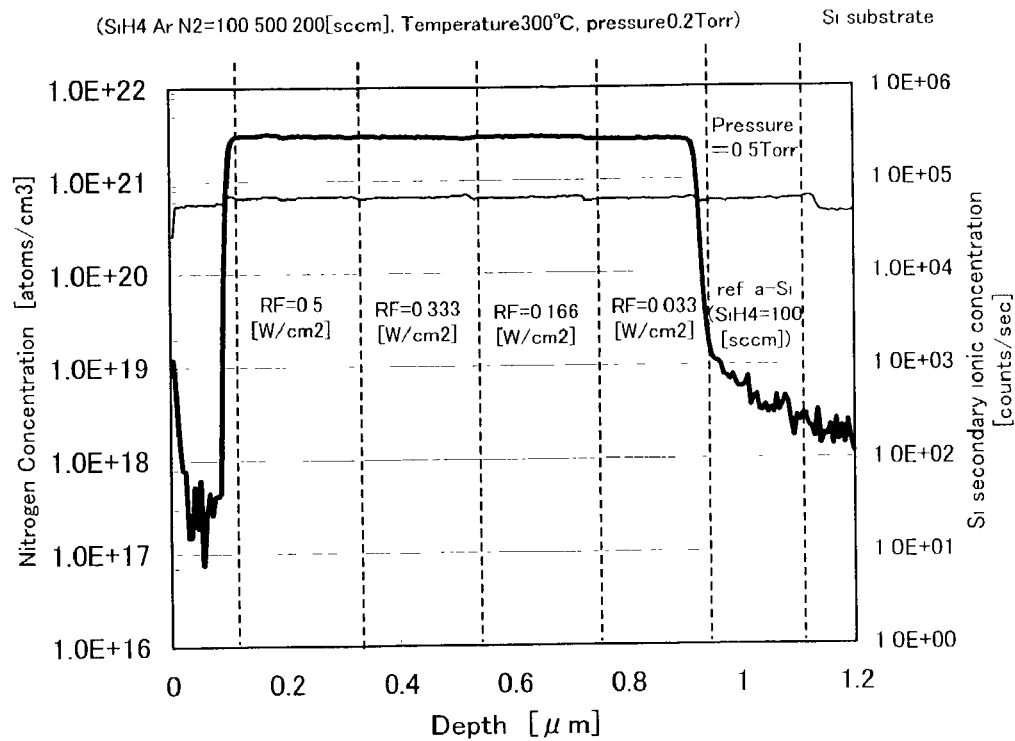
FIG. 5A is a graph indicating SIMS data related to a concentration of nitrogen and FIG. 5B is a graph indicating SIMS data related to a concentration of oxygen (Experiment 2)
Figure 5B:
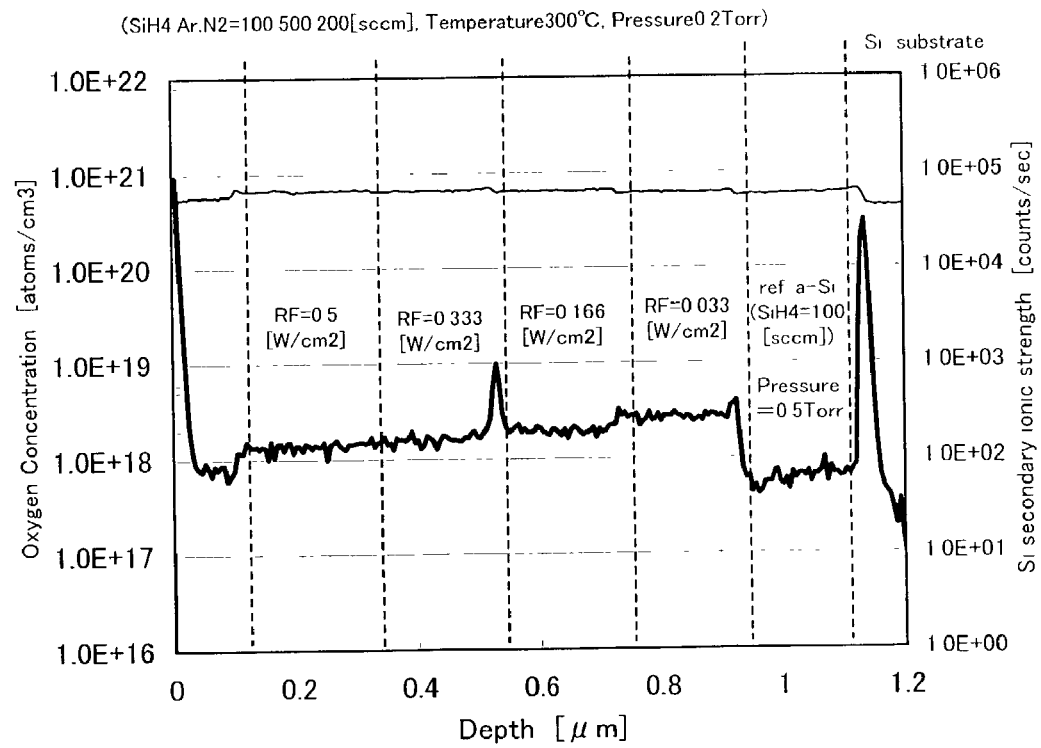
Figure 6A:
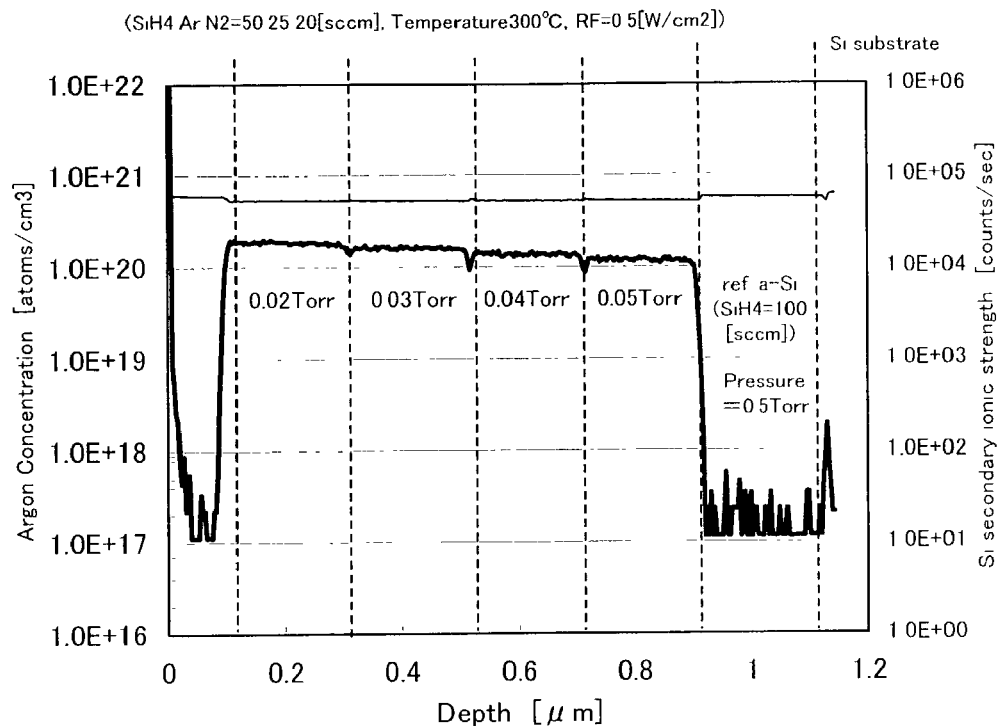
FIG. 6A is a graph indicating SIMS data related to a concentration of argon and FIG. 6B is a graph indicating SIMS data related to a concentration of fluorine (pressure dependence) (Experiment 3)
Figure 6B:
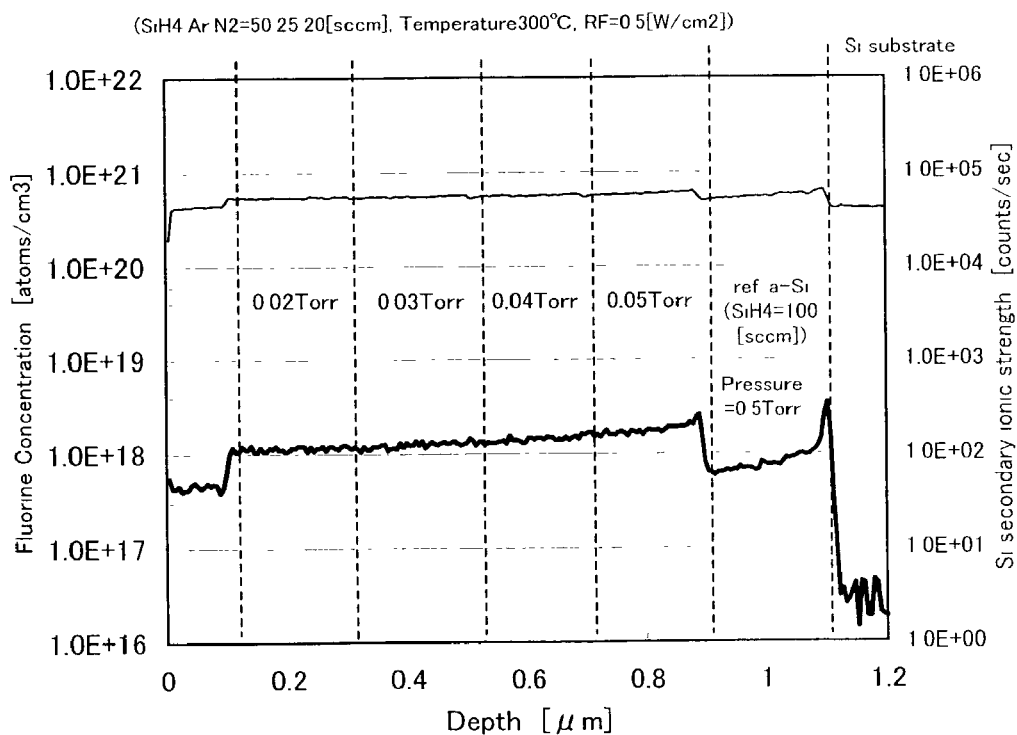
Figure 7A:
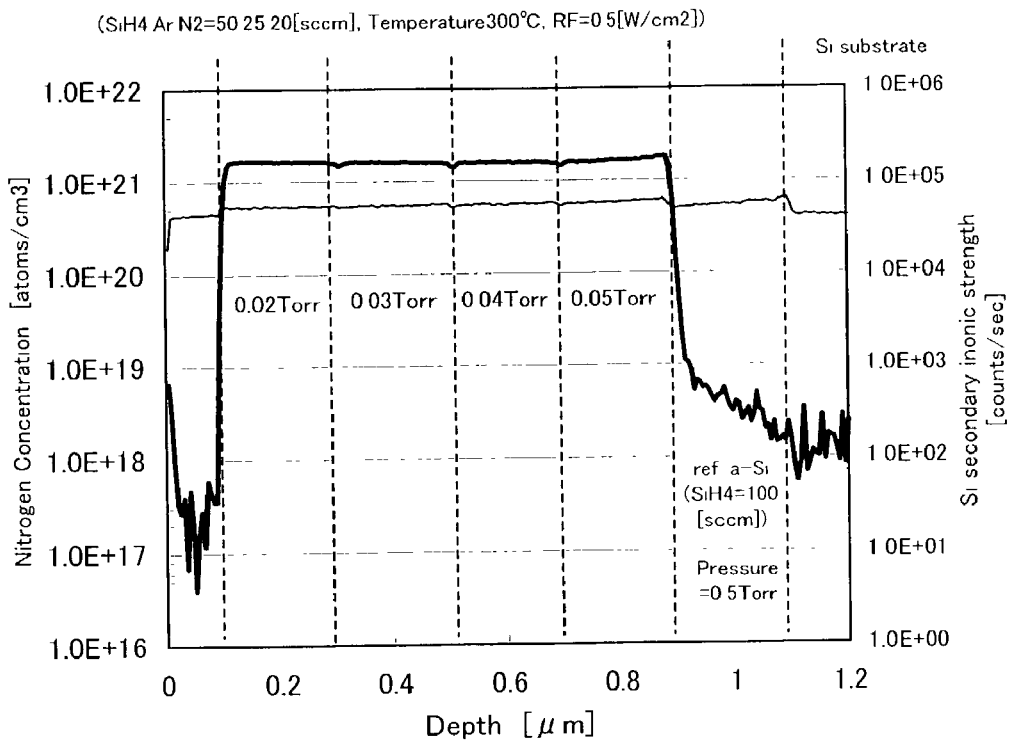
FIG. 7A is a graph indicating SIMS data related to a concentration of nitrogen and FIG. 7B is a graph indicating SIMS data related to a concentration of oxygen (Experiment 3)
Figure 7B:
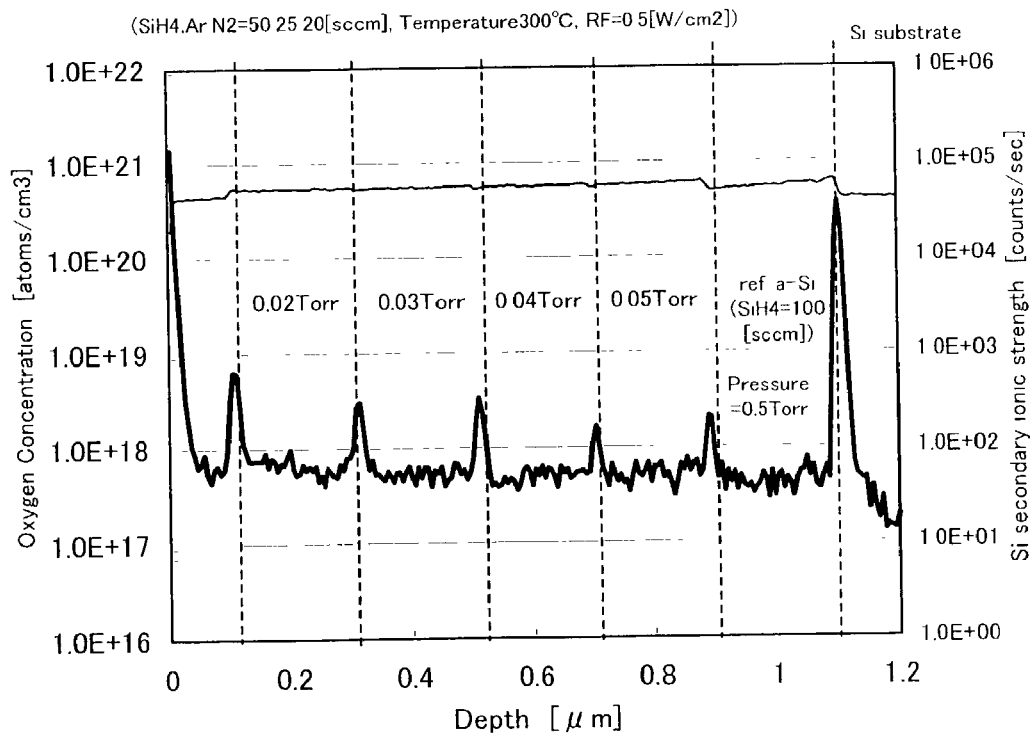

Also, the present invention is not limited to the TFT structure shown in FIG. 1G. If needed, a low concentration drain (LDD: lightly doped drain) structure in which a LDD region is located between the channel forming region and the drain region (or the source region) may be used. This structure is obtained by providing a region to which an impurity element is added at a low concentration between the channel forming region and the source region or the drain region which each is formed by adding an impurity element thereto at a high concentration. This region is called the LDD region. Further, a so-called GOLD (gate-drain overlapped LDD) structure in which the LDD region is overlapped with the gate electrode through the gate insulating film may be used.

Here, the n-channel TFT is described. However, it is needless to say that a p-channel TFT can be formed by using a p-type impurity element instead of an n-type impurity element.

Also, the example of a top gate TFT is described here. However, the present invention can be applied independent on a TFT structure. For example, the present invention can be applied to a bottom gate (inverse staggered) TFT or a staggered TFT.

(Embodiment Mode 2)

Here, an example using a semiconductor film which includes al noble gas element and nitrogen and has an amorphous structure according to the present invention as an active layer of a TFT will be described.

First, a gate electrode is formed on a substrate having an insulating surface, a gate insulating film covering the gate electrode is formed, and a first semiconductor film which includes a noble gas element and nitrogen and has an amorphous structure according to the present invention is formed on the gate insulating film. Here, a first semiconductor film which includes argon at a concentration of $1\times10^{18}/cm^3$ to $1\times10^{22}/cm^3$, preferably, $1\times10^{20}/cm^3$ to $1\times10^{21}/cm^3$ and has an amorphous structure can be formed by a plasma CVD method using monosilane, argon, and nitrogen as raw gases. Next, a second semiconductor film containing an impurity element having one conductivity type (n-type or p-type) is laminated on the first semiconductor film. Then, an unnecessary portion except for a portion as an active layer of the first semiconductor having the amorphous structure is removed by etching. Next, a conductive film is formed on the entire surface and then a portion of the conductive film and a portion of the second semiconductor film containing the impurity element having one conductivity type (n-type or p-type) are removed to form a source region and a drain region which are made from the semiconductor film, and simultaneously a drain wiring and a source wiring which are made from the conductive film are formed. Further a portion of the first semiconductor film is removed to manufacture a channel etch type TFT having a bottom gate structure. When a pixel electrode is provided to the TFT, such a TFT can be used as a TFT in a pixel portion of a liquid crystal display device.

Also, the present invention is not limited to the above TFT which is called (in amorphous silicon TFT, and can be applied to an active layer of a TFT which is called a polysilicon TFT.

In this case, the first semiconductor film which includes the noble gas element and nitrogen and has the amorphous structure according to the present invention is used as the first semiconductor film 12 having the amorphous structure which is provided on the base insulating film as indicated in Embodiment Mode 1. Then, preferably, crystallization is conducted by a crystallization technique (solid phase epitaxy, laser crystallization method, solid phase epitaxy by thermal treatment using a metallic element as a catalyst, or the like) to form a semiconductor having a crystalline structure and patterned to obtain an active layer of a TFT. Here, a first semiconductor film which includes argon at a concentration of $1\times10^{18}/cm^3$ to $1\times10^{22}/cm^3$, preferably, $1\times10^{20}/cm^3$ to $1\times10^{21}/cm^3$ and has an amorphous structure can be formed by a plasma CVD method using monosilane, argon, and nitrogen as raw gases.

For example, laser crystallization is conducted after the first semiconductor film which includes the noble gas element and nitrogen and has the amorphous structure according to the present invention is formed on a substrate having an insulating surface.

An excimer laser, a YAG laser, a $YVO_4$ laser, a YLF laser, a $YAlO_3$ laser, a glass laser, a ruby laser, an alexandrite laser, a Ti:sapphire laser, or the like, which is a pulse oscillation type or a continuous light emitting type, can be used for laser light. When these lasers are used, a method of linearly condensing a laser beam emitted form a laser oscillator by an optical system and irradiating it to the semiconductor film is preferably used. A crystallization condition is selected as appropriate by an executor. When a pulse oscillation excimer laser is used, a pulse oscillation frequency is set to be 30 Hz and a laser energy density is set to be 100 mJ/cm² to 400 mJ/cm² (typically, 200 mJ/cm² to 300 mJ/cm²). When a YAG laser or a $YVO_4$ laser which is a pulse oscillation type is used, it is desirable that the second harmonic wave or the third harmonic wave is used, a pulse oscillation frequency is set to be 1 kHz to 10 kHz and a laser energy density is set to be 300 mJ/cm² to 600 mJ/cm² (typically, 350 mJ/cm² to 500 mJ/cm²). Laser light linearly condensed at a width of 100 μm to 1000 μm, for example, 400 μm is irradiated onto the entire surface of the substrate. At this time, an overlap ratio of the linear laser light may be set to be 80% to 98%.

Also, when a continuous oscillation laser represented by a $YVO_4$ laser is used, laser light emitted from a continuous oscillation $YVO_4$ laser having an output of 10 W is converted into harmonic waves (second harmonic wave to fourth harmonic wave) by a non-linear optical element. In addition, there is a method of emitting a harmonic wave by locating a $YVO_4$ crystal and a non-linear optical element in a resonator. Preferably, laser light having a rectangular shape or an elliptical shape is formed on an irradiation surface by an optical system and irradiated to an object to be processed. At this time, an energy density of about 0.01 MW/cm² to 100 MW/cm² (preferably, 0.1 MW/cm² to 10 MW/cm²) is required. It is preferable that the semiconductor film is moved relatively to the laser light at a speed of about 0.5 cm/s to 2000 cm/s and irradiated with it.

(Embodiment Mode 3)

When respective elements are formed on a substrate and then the elements such as TFTs are separated from the substrate, a semiconductor film which includes a noble gas element and nitrogen and has an amorphous structure according to the present invention call be also used as a layer in which a peeling phenomenon is caused therein or in an interlace by etching processing or laser light irradiation (a peeling layer). The peeling layer is provided on and in contact with the substrate and an insulating film and a TFT are formed on the peeling layer.

Also, an etching rate to the semiconductor film which includes the noble gas element and nitrogen and has the amorphous structure according to the present invention is different from that to a conventional semiconductor film having an amorphous structure. Thus, the semiconductor film which includes the noble gas element and nitrogen and has the amorphous structure according to the present invention can be used as an etching stopper in various etching steps.

Further, the semiconductor film which includes the noble gas element and has the amorphous structure according to the present invention can be also used as a gettering site for a semiconductor film crystallized by another method different from the method described in Embodiment Mode 1 and a general semiconductor film except such a semiconductor film.

The present invention made by the above structure will be described in more detail based on the following embodiment.

(Embodiment 1)

An embodiment of the present invention is described with reference to FIGS. 8 to 10. Here, a method of simultaneously manufacturing a pixel portion and TFTs (n-channel TFTs and a p-channel TFT) of a driver circuit provided in the periphery of the pixel portion oil the same substrate is described in detail.

First, a base insulating film 101 is formed on a substrate 100, and a first semiconductor film having a crystalline structure is obtained. Then, the semiconductor film is etched to have a desired shape to form semiconductor layers 102 to 106 separated from one another in an island shape.

A glass substrate (#1737) is used as the substrate 100. For the base insulating film 101, a silicon oxynitride film 101a formed from $SiH_4$, $NH_3$, and $N_2O$ as material gases, (composition ratio: Si=32%, O=27%, N=24%, H=17%) is formed with a thickness of 50 nm (preferably 10 to 200 nm) and at a film deposition temperature of 400° C. by using plasma CVD. Then, after the surface is cleaned with ozone water, an oxide film on the surface is removed by means of dilute hydrofluoric acid (dilution with 1/100). Next, a silicon hydride oxynitride film 101b formed from $SiH_4$ and $N_2O$ as material gases (composition ratio: Si=32%, O=59%, N=7%, H=2%) is formed thereon with a thickness of 100 nm (preferably 50 to 200 nm) and at a film deposition temperature of 400° C. by using plasma CVD to thereby form a lamination. Further, without exposure to an atmosphere, a semiconductor film having an amorphous structure (in this case, amorphous silicon film) is formed to have a thickness of 54 nm (preferably 25 to 80 nm) with $SiH_4$ as a film deposition gas and at a film deposition temperature of 300° C. by using plasma CVD.

In this embodiment, the base film 101 is shown in a form of a two-layer structure, but a single layer of the insulating film or a structure in which two or more layers thereof are laminated may be adopted. Further, there is no limitation on the material of the semiconductor film. However, the semiconductor film may be preferably formed of silicon or silicon germanium ($Si_{1-X}Ge_X$ (X=0.0001 to 0.02)) alloy by using a known means (sputtering, LPCVD, plasma CVD, or the like). Further, a plasma CVD apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface. Then, in order to control a threshold value of a TFT, doping of a minute amount of impurity clement (boron or phosphorous) is performed. Here, an ion doping method is used in which diborane ($B_2H_6$) is plasma-excited without mass-separation, and boron is added to the amorphous silicon film under the doping conditions: an acceleration voltage of 1.5 kV; a gas flow rate of diborane diluted to 1% with hydrogen of 30 sccm; and a dosage of $2\times10^{12}/cm^2$.

Then, a nickel acetate salt solution containing nickel of 10 ppm in weight is applied using a spinner. Instead of the application, a method of spraying nickel elements to the entire surface by sputtering may also be used.

Then, heat treatment is conducted to perform crystallization, thereby forming a semiconductor film having a crystalline structure. A heating process using an electric furnace or irradiation of strong light may be conducted for this heat treatment. In case of the heating process using an electric furnace, it may be conducted at 500 to 650° C. for 4 to 24 hours. Here, after the heating process (500° C. for 1 hour) for dehydrogenation is conducted, the heating process (550° C. for 4 hours) for crystallization is conducted, thereby obtaining a silicon film having a crystalline structure. Note that, although crystallization is performed by using the heating process using a furnace, crystallization may be performed by means of a lamp annealing apparatus. Also note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline structure is removed by dilute hydrofluoric acid or the like, irradiation of first laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In any case, pulse laser light with a repetition frequency of approximately 10 to 1000 Hz is used, the pulse laser light is condensed to 100 to 500 $mJ/cm^2$ by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 393 $mJ/cm^2$. Note that an oxide film is formed on the surface by the first laser light irradiation since the irradiation is conducted in an atmosphere or in an oxygen atmosphere.

Next, after the oxide film formed by the first light irradiation is removed by dilute hydrofluoric acid, second laser light irradiation is performed in a nitrogen atmosphere or in a vacuum, thereby leveling the semiconductor film surface. Excimer laser light with a wavelength of 400 nm or less, or second harmonic wave or third harmonic wave of a YAG laser is used as the laser light (second laser light). The energy density of the second laser light is made larger than that of the first laser light, preferably made larger by 30 to 60 $mJ/cm^2$. Here, the second laser light irradiation is performed with a repetition frequency of 30 Hz and energy density of 453 $mJ/cm^2$ to thereby set a P-V value (peak to valley, the difference between the maximum value and the minimum value in height) of unevenness in the semiconductor film surface to 50 nm or less. Here, the P-V value of unevenness may be observed with AFM (atomic force microscope).

Further, although the second laser light irradiation is conducted over the surface in this embodiment, a step of selectively performing irradiation at least on a pixel portion may be adopted since the reduction of an off current particularly has an effect on a TFT of the pixel portion.

Although an example of leveling surface of the semiconductor film by irradiation of the second laser light is shown in this embodiment, the leveling is not always necessary to conduct.

Next, the surface is processed with ozone water for 120 seconds, thereby forming a barrier layer comprised of an oxide film with a thickness of 1 to 5 nm in total.

Then, an amorphous silicon film containing an argon element, which becomes a gettering site, is formed on the barrier layer to have a thickness of 150 nm by plasma CVD described in Embodiment Mode 1. The film deposition condition with plasma CVD described in this embodiment are: a substrate temperature of 300° C.; and a film deposition pressure of inside of a chamber of 26.66 Pa (0.2 torr). $SiH_4$ gas flow rate of 100 sccm, argon gas flow rate of 500 sccm, and nitrogen gas flow rate of 200 sccm are introduced into the chamber respectively thorough a gas introduction system, thereby conducting electric charge at an oscillation frequency of 27.12 MHz and RF power of 300 W (RF power density of 0.5 $W/Cm^2$) by a high-frequency power source. Note that under the above conditions, the atomic concentration of the argon element contained in the amorphous silicon film is $1\times10^{20}/cm^3$ to $1\times10^{21}/cm^3$, and the atomic concentration of oxygen is $1\times10^{20}/cm^3$ to $1\times10^{21}/cm^3$. Thereafter, heat treatment at 650° C. for 3 minutes is conducted using the lamp annealing apparatus to perform gettering.

Subsequently, the amorphous silicon film containing the argon clement, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers 102 to 106 separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 107, is formed. In this embodiment, a silicon oxynitride film (composition ratio: Si=32%, O=59%, N=7%, H=2%) is formed with a thickness of 115 nm by plasma CVD.

Next, as shown in FIG. 8A, on the gate insulating film 107, a first conductive film 108a with a thickness of 20 to 100 nm and a second conductive film 108b with a thickness of 100 to 400 nm are formed in lamination. In this embodiment, a 50 nm thick tantalum nitride film and a 370 nm thick tungsten film are sequentially laminated on the gate insulating film 107.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may he used in place of the alloy film of aluminum and silicon (Al—Si) of the second conductive film, and a titanium film may be used in place of the titanium nitride film of the third conductive film. In addition, a single layer structure may also be adopted.

Next, as shown in FIG. 8B, masks 110 to 115 made of resist are formed by an exposure step, and a first etching process for forming gate electrodes and wirings is performed. The first etching process is performed with first and second etching conditions. An ICP (inductively coupled plasma) etching method may be preferably used for the etching process. The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to have a desired taper shape. Note that chlorine-based gases typified by $Cl_2$, $BCl_3$, $SiCl_4$, and $CCl_4$, fluorine-based gases typified by $CF_4$, $SF_6$, and $NF_3$, and $O_2$ can be appropriately used as etching gases.

In this embodiment, RF (13.56 MHz) power of 150 W is applied also to the substrate (sample stage) to substantially apply a negative self-bias voltage. Note that, size of the electrode area on the substrate side is 12.5 cm×12.5 cm, and coil-shape electrode (a quartz disc comprising a coil is used here) has 25 cm in diameter. With the first etching conditions, a W film is etched to form an end portion of the first conductive layer into a tapered shape. Under the first etching conditions, an etching rate to W is 200.39 nm/min, an etching rate to TaN is 80.32 nm/min, and a selection ratio of W to TaN is about 2.5. Further, with the first etching conditions, a taper angle of W is approximately 26°. Thereafter, the first etching conditions are changed to the second etching conditions without removing the masks 110 to 115 made of resist. $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage.

Under the second etching conditions in which $CF_4$ and $Cl_2$ are mixed, both the W film and the TaN film are etched at the same level. With the second etching conditions, an etching rate to W is 58.97 nm/min, and an etching rate to TaN is 66.43 nm/min. Note that an etching time may be increased by 10 to 20% in order to conduct etching without remaining residue on the gate insulating film.

In the first etching process as described above, the shape of the mask made of resist is made appropriate, whereby the end portion of the first conductive layer and the end portion of the second conductive layer each have a tapered shape due to the effect of the bias voltage applied to the substrate side. The angle of the tapered portion is sufficiently set to 15 to 45°.

Thus, first shape conductive layers 117 to 121 composed of the first conductive layer and the second conductive layer (first conductive layers 117a to 122a and second conductive layers 117b to 122b) are formed by the first etching process. The insulating film 107 that becomes the gate insulating film is etched by approximately 10 to 20 nm, and becomes a gate insulating film 116 in which regions which are not covered by the first shape conductive layers 117 to 122 are thinned.

Next, a second etching process is conducted without removing the masks made of resist (FIG. 8C). Here, $SF_6$, $Cl_2$ and $O_2$ are used as etching gases, the flow rate of the gases is set to 24/12/24 (sccm), and RF (13.56 MHz) power of 700 W is applied to a coil-shape electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching process, an etching rate to W is 227.3 nm/min, an etching rate to TaN is 32.1 nm/min, a selection ratio of W to TaN is 7.1, an etching rate to SiON that is the insulating film 116 is 33.7 nm/min, and at selection ratio of W to SiON is 6.83. In the case where $SF_6$ is used as the etching gas, the selection ratio with respect to the insulating film 116 is high as described above. Thus, reduction in the film thickness can be suppressed. In this embodiment, the film thickness of the insulating film 116 is reduced by only about 8 nm.

By the second etching process, the taper angle of W becomes 70°. By the second etching process, second conductive layers 124b to 129b are formed. On the other hand, the first conductive layers are hardly etched to become first conductive layers 124a to 129a. Note that the first conductive layers 124a to 129a have substantially the same size as the first conductive layers 117a to 122a. Actually, the width of the first conductive layer may be reduced by approximately 0.3 μm, namely, approximately 0.6 μm in the total line width in comparison with that before executing the second etching process. However, there is almost no change in size of the first conductive layer. Note that, in FIGS. 8B and 8C, although the width of the taper portion of the first conductive layers has the same size as that of the second conductive layers, the tapered portion of the first conductive layers is changed according to the wirings width because there is dependence of the tapered portion length on the wirings width.

Further, in the case where, instead of the two-layer structure, the three-layer structure is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as material gases; the flow rate of the gases is set to 65/10/5 (sccm); RF (13.56 MHz) power of 300 W is applied to the substrate side (sample stage); and RF (13.56 MHz) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used, the flow rate of the gases is set to 25/25/10 (sccm), RF (13.56 MHz) power of 20 W is also applied to the substrate side (sample stage); and RF (13.56 MHz) power of 500 W is applied to a coil-shape electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 seem, RF (13.56 MHz) power of 100 W is applied to the substrate side (sample stage), and RF (13.56 MHz) power of 600 W is applied to a coil-shape electrode with a pressure of 1.2 Pa to generate plasma, thereby performing etching.

Next, the masks made of resist are removed, and then, a first doping process is conducted to obtain the state of FIG. 8D. The doping process may be conducted by ion doping or ion implantation. Ion doping is conducted with the conditions of a dosage of $1.5 \times 10^{14}$ atoms/cm$^2$ and an accelerating voltage of 60 to 100 keV. As an impurity element imparting n-type conductivity, phosphorous (P) or arsenic (As) is typically used. In this case, first conductive layers and second conductive layers 124 to 128 become masks against the impurity element imparting n-type conductivity, and first impurity regions 130 to 134 are formed in a self-aligning manner. The impurity element imparting n-type conductivity is added to the first impurity regions 130 to 134 in a concentration range of $1 \times 10^{16}$ to $1 \times 10^{17}$/cm$^3$. Here, the region having the same concentration range as the first impurity region is also called an n$^{--}$ region.

Note that although the first doping process is performed after the removal of the masks made of resist in this embodiment, the first doping process may be performed without removing the masks made of resist. For the convenience of explanation, the taper portion of the first conductive layers has the same size as shown in FIG. 8D, the tapered portion of the first conductive layers is changed in accordance with the wirings width. Therefore, if a plurality of wirings having different width are formed on the same substrate, the doping region may also be differed each other.

Subsequently, as shown in FIG. 9A, masks 135 to 137 made of resist are formed, and a second doping process is conducted. The mask 135 is a mask for protecting a channel forming region and a periphery thereof of a semiconductor layer forming a p-channel TFT of a driver circuit, the mask 136 is a mask for protecting a channel forming region and a periphery thereof of a semiconductor layer forming one of n-channel TFTs of the driver circuit, and the mask 137 is a mask for protecting a channel forming region, a periphery thereof, and a region to function as a storage capacitor of a semiconductor layer forming a TFT of a pixel portion.

With the ion doping conditions in the second doping process: a dosage of $1.5 \times 10^{15}$ atoms/cm$^2$; and an accelerating voltage of 60 to 100 keV, phosphorous (P) is doped. Here, impurity regions are formed in the respective semiconductor layers in a self-aligning manner with the second conductive layers 124b to 126b as masks. Of course, phosphorous is not added to the regions covered by the masks 135 to 137. Thus, second impurity regions 138 to 140 and a third impurity region 142 are formed. The impurity element imparting n-type conductivity is added to the second impurity regions 138 to 140 in a concentration range of $1 \times 10^{20}$ to $1 \times 10^{21}$/cm$^3$. Here, the region having the same concentration range as the second impurity region is also called an n$^+$ region.

Further, the third impurity region is formed at a lower concentration than that in the second impurity region by the first conductive layer, and is added with the impurity element imparting n-type conductivity in a concentration range of $1 \times 10^{18}$ to $1 \times 10^{19}$/cm$^3$. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is called an n$^-$ region. Furthermore, the regions covered by the masks 136 and 137 are not added with the impurity element in the second doping process, and become first impurity regions 144 and 145.

Next, after the masks 135 to 137 made of resist are removed, masks 146 to 148 made of resist are newly formed, and a third doping process is conducted as shown in FIG. 9B.

In the driver circuit, by the third doping process as described above, fourth impurity regions 149, 150 and fifth impurity regions 151, 152 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 149 and 150 in a concentration range of $1 \times 10^{20}$ to $1 \times 10^{21}$/cm$^3$. Note that, in the fourth impurity regions 149, 150, phosphorous (P) has been added in the preceding step (n$^{--}$ region), but the impurity element imparting p-type conductivity is added at a concentration that is 1.5 to 3 times as high as that of phosphorous. Thus, the fourth impurity regions 149, 150 have a p-type conductivity. Here, the region having the same concentration range as the fourth impurity region is also called a p$^+$ region.

Further, fifth impurity regions 151 and 152 are formed in regions overlapping the tapered portion of the second conductive layer 125a, and are added with the impurity element imparting p-type conductivity in a concentration range of $1 \times 10^{18}$ to $1 \times 10^{20}$/cm$^3$. Here. the region having the same concentration range as the fifth impurity region is also called a p$^-$ region.

Through the above-described steps, the impurity regions having n-type or p-type conductivity are formed in the respective semiconductor layers. The conductive layers 124 to 127 become gate electrodes of a TFT. Further, the conductive layer 128 becomes one of electrodes, which forms the storage capacitor in the pixel portion. Moreover, the conductive layer 129 forms a source wiring in the pixel portion.

Further, if the conductive layers 124 to 127 and the impurity regions (the first impurity region thorough the fifth impurity region) can be formed, there are no limitations placed on the above-mentioned order of process steps. Each etching order and doping order may be freely changed.

Next, an insulating film (not shown) that covers substantially the entire surface is formed. In this embodiment, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this embodiment, a step of forming the insulating film may be conducted after the activation is conducted.

Next, a first interlayer insulating film 153 is formed of a silicon nitride film, and heat treatment (300 to 550° C. for 1 to 12 hours) is performed, thereby conducting a step of hydrogenating the semiconductor layers. (FIG. 9C) This step is a step of terminating dangling bonds of the semiconductor layers by hydrogen contained in the first interlayer insulating film 153. The semiconductor layers can be hydrogenated irrespective of the existence of an insulating film (not shown) formed of a silicon oxide film. Incidentally, in this embodiment, a material containing aluminum as its main constituent is used for the second conductive layer, and thus, it is important to apply the heating process condition that the second conductive layer can withstand in the step of hydrogenation. As another means for hydrogenation, plasma hydrogenation (using hydrogen excited by plasma) may be conducted.

Next, a second interlayer insulating film 154 is formed from an organic insulating material on the first interlayer insulating film 153. In this embodiment, an acrylic resin film with a thickness of 1.6 µm is formed. Then, a contact hole that reaches the source wiring 129, contact holes that respectively reach the conductive layers 127 and 128, and contract holes that reach the respective impurity regions are formed. In this embodiment, a plurality of etching processes are sequentially performed. In this embodiment, the second interlayer insulting film is etched with the first interlayer insulating film as the etching stopper, the first interlayer insulating film is etched with the insulating film (not shown) as the etching stopper, and then, the insulating film (not shown) is etched.

Thereafter, wirings and pixel electrode are formed by using Al, Ti, Mo, W and the like. As the material of the electrodes and pixel electrode, it is desirable to use a material excellent in reflecting property, such as a film containing Al or Ag as its main constituent or a lamination film of the above film. Thus, source electrodes or drain electrodes 155 to 160, a gate wiring 162, a connection wiring 161, and a pixel electrode 163 are formed.

As described above, a driver circuit 206 having an n-channel TFT 201, a p-channel TFT 202, and an n-channel TFT 203 and a pixel portion 207 having a pixel TFT 204 comprised of an n-channel TFT and a storage capacitor 205 can be formed on the same substrate. (FIG. 10) In this specification, the above substrate is called an active matrix substrate for the sake of convenience.

In the pixel portion 207, the pixel TFT 204 (n-channel TFT) has a channel forming region 167, the first impurity region (n$^-$ region) 145 formed outside the conductive layer 127 forming the gate electrode, and the second impurity region (n$^+$ region) 140 functioning as a source region. Further, in the semiconductor layer functioning as one of the electrodes of the storage capacitor 205, the fourth impurity region 150 and the fifth impurity region 152 fare formed. The storage capacitor 205 is constituted of the second electrode 128 and the semiconductor layers 150, 152, and 168 with the insulating film (the same film as the gate insulating film) 116 as dielectric.

Further, in the driver circuit 206, the n-channel TFT 201 (first n-channel TFT) has a channel forming region 164, the third impurity region (n$^-$ region) 142 that overlaps a part of the conductive layer 124 forming the gate electrode through the insulating film, and the second impurity region (n$^+$ region) 138 functioning as a source region or a drain region.

Further, in the driver circuit 206, the p-channel TFT 202 has a channel forming region 165, the fifth impurity region (p$^-$ region) 151 that overlaps a part of the conductive layer 125 forming the gate electrode through the insulating film, and the fourth impurity region (p$^+$ region) 149 functioning as a source region or a drain region.

Furthermore, in the driver circuit 206, the n-channel TFT 203 (second n-channel TFT) has a channel forming region 166, the first impurity region (n$^{--}$ region) 144 outside the conductive layer 126 forming the gate electrode, and the second impurity region (n$^+$ region) 139 functioning as a source region or a drain region.

The above TFTs 201 to 203 are appropriately combined to form a shift resister circuit, a buffer circuit, a level shifter circuit, a latch circuit and the like, thereby forming the driver circuit 206. For example, in the case where a CMOS circuit is formed, the n-channel TFT 201 and the p-channel TFT 202 may be complementarily connected to each other.

In particular, the structure of the n-channel TFT 203 is appropriate for the buffer circuit having a high driving voltage with the purpose of preventing deterioration due to a hot carrier effect.

Moreover, the structure of the n-channel TFT 201, which is it GOLD structure, is appropriate for the circuit in which the reliability takes top priority.

From the above, the reliability can be improved by improving the flatness of the semiconductor film surface. Thus, in the TFT having the GOLD structure, sufficient reliability can be obtained even if the area of the impurity region that overlaps the gate electrode through the gate insulating film is reduced. Specifically, in the TFT having the GOLD structure, sufficient reliability can be obtained even if the size of the portion that becomes the tapered portion of the gate electrode is reduced.

In the TFT with the GOLD structure, a parasitic capacitance increases when the gate insulating film is thinned. However, the size of the tapered portion of the gate electrode (first conductive layer) is reduced to reduce the parasitic capacitance, whereby the TFT becomes to enable high-speed operation with improved characteristics and to have sufficient reliability.

Note that, in the pixel TFT of the pixel portion 207 as well, the second laser light irradiation enables the reduction in off current and the reduction in fluctuation.

Further, an example of manufacturing the active matrix substrate for forming a reflection type display device is shown in this embodiment. However, if the pixel electrode is formed of a transparent conductive film, a transmission type display device can be formed although the number of photomasks is increased by one.

(Embodiment 2)

This embodiment describes a process of manufacturing an active matrix liquid crystal display device from the active matrix substrate fabricated in Embodiment 1. The description is given with reference to FIG. 11.

Figure 10:
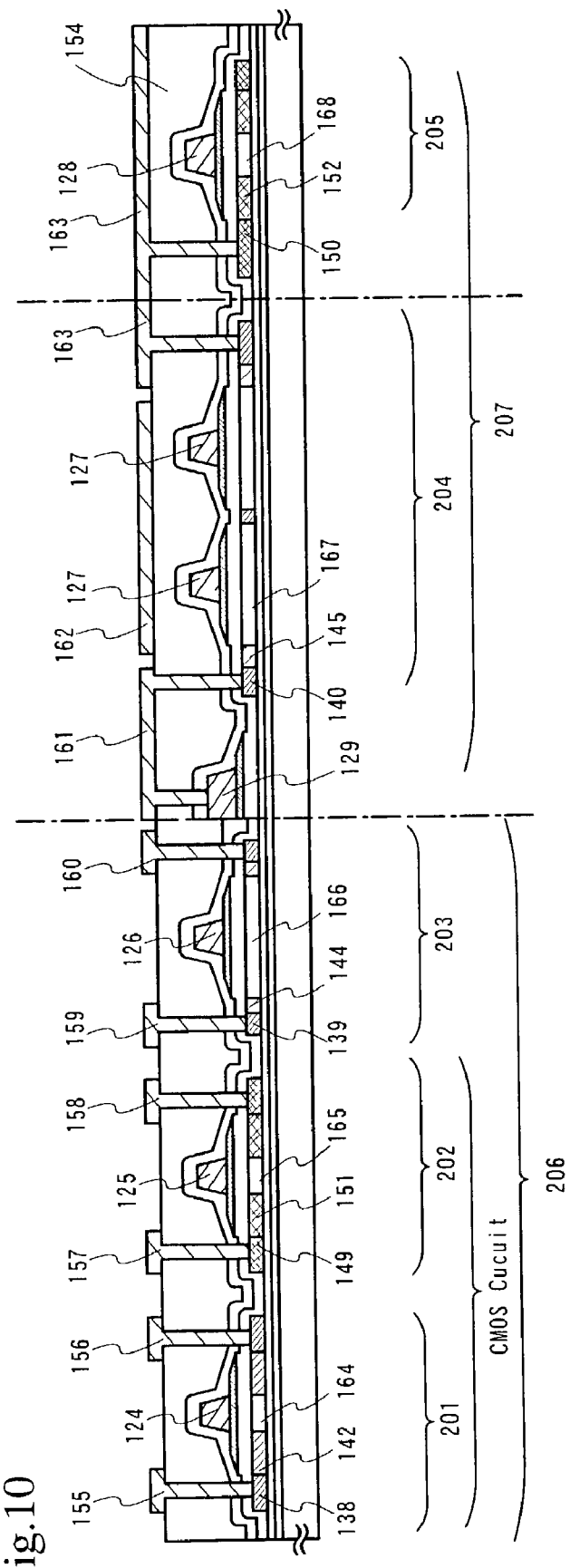
FIG. 10 is a sectional structural view of an active matrix substrate.

After the active matrix substrate as illustrated in FIG. 10 is obtained in accordance with Embodiment 1, an oriented film is formed on the active matrix substrate of FIG. 10 and subjected to rubbing treatment. In this embodiment, before the oriented film is formed, an organic resin film such as an acrylic resin film is patterned to form columnar spacers in desired positions in order to keep the substrates apart. The columnar spacers may be replaced by spherical spacers sprayed onto the entire surface of the substrate.

An opposite substrate is prepared next. The opposite substrate has a color filter in which colored layers and light-shielding layers are arranged with respect to the pixels. A light-shielding layer is also placed in the driving circuit portion. A leveling film is formed to cover the color filter and the light-shielding layer. On the leveling film, an opposite electrode is formed from a transparent conductive film in the pixel portion. An oriented film is formed over the entire surface of the opposite substrate and is subjected to rubbing treatment.

Then the opposite substrate is bonded to the active matrix substrate on which the pixel portion and the driving circuits are formed, using a scaling member. The sealing member has filler mixed therein and the filler, together with the columnar spacers, keeps the distance between the two substrates while they are bonded. Thereafter a liquid crystal material is injected between the substrates and an encapsulant (not shown) is use to completely seal the substrates. A known liquid crystal material can be used. The active matrix liquid crystal display device is thus completed. If necessary, the active matrix substrate or the opposite substrate is cut into pieces of desired shapes. The display device may be appropriately provided with a polarizing plate using a known technique. Then FPCs are attached to the substrate using a known technique.

Figure 11:
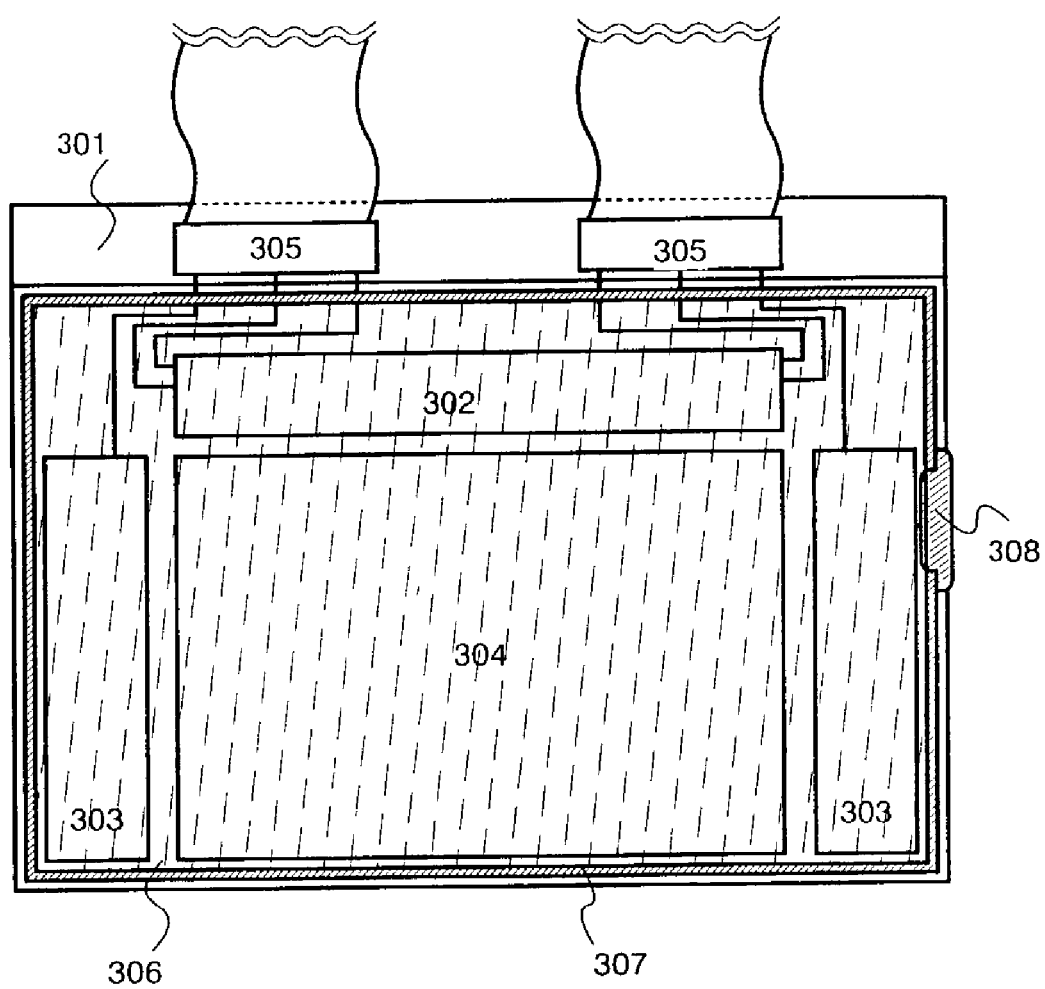
FIG. 11 shows an exterior of an AM-LCD.

The structure of the thus obtained liquid crystal module is described with reference to the top view in FIG. 11.

A pixel portion 304 is placed in the center of an active matrix substrate 301. A source signal line driving circuit 302 for driving source signal lines is positioned above the pixel portion 304. Gate signal line driving circuits 303 for driving gate signal lines are placed to the left and right of the pixel portion 304. Although the gate signal line driving circuits 303 are symmetrical with respect to the pixel portion in this embodiment, the liquid crystal module may have only one gate signal line driving circuit on one side of the pixel portion. Of the above two options, a designer can choose the arrangement that suits better considering the substrate size or the like of the liquid crystal module. However, the symmetrical arrangement of the gate signal line driving circuits shown in FIG. 11 is preferred in terms of circuit operation reliability, driving efficiency, and the like.

Signals are inputted to the driving circuits from flexible printed circuits (FPC) 305. The FPCs 305 are press-fit through an anisotropic conductive film or the like after opening contact holes in the interlayer insulating film and resin film and forming a connection electrode so as to reach the wiring lines arranged in given places of the substrate 301. The connection electrode is formed from ITO in this embodiment.

A sealing agent 307 is applied to the substrate along its perimeter surrounding the driving circuits and the pixel portion. An opposite substrate 306 is bonded to the substrate 301 by the sealing agent 307 while a spacer formed in advance on the active matrix substrate keeps the distance between the two substrates constant (the distance between the substrate 301 and the opposed substrate 306). A liquid crystal element is injected through an area of the substrate that is not coated with the sealing agent 307. The substrates are then sealed by an encapsulant 308. The liquid crystal module is completed through the above steps.

Although all of the driving circuits are formed on the substrate in the example shown here, several ICs may be used for some of the driving circuits.

Further, this embodiment can be freely combined with Embodiment 1.

(Embodiment 3)

Figure 12:
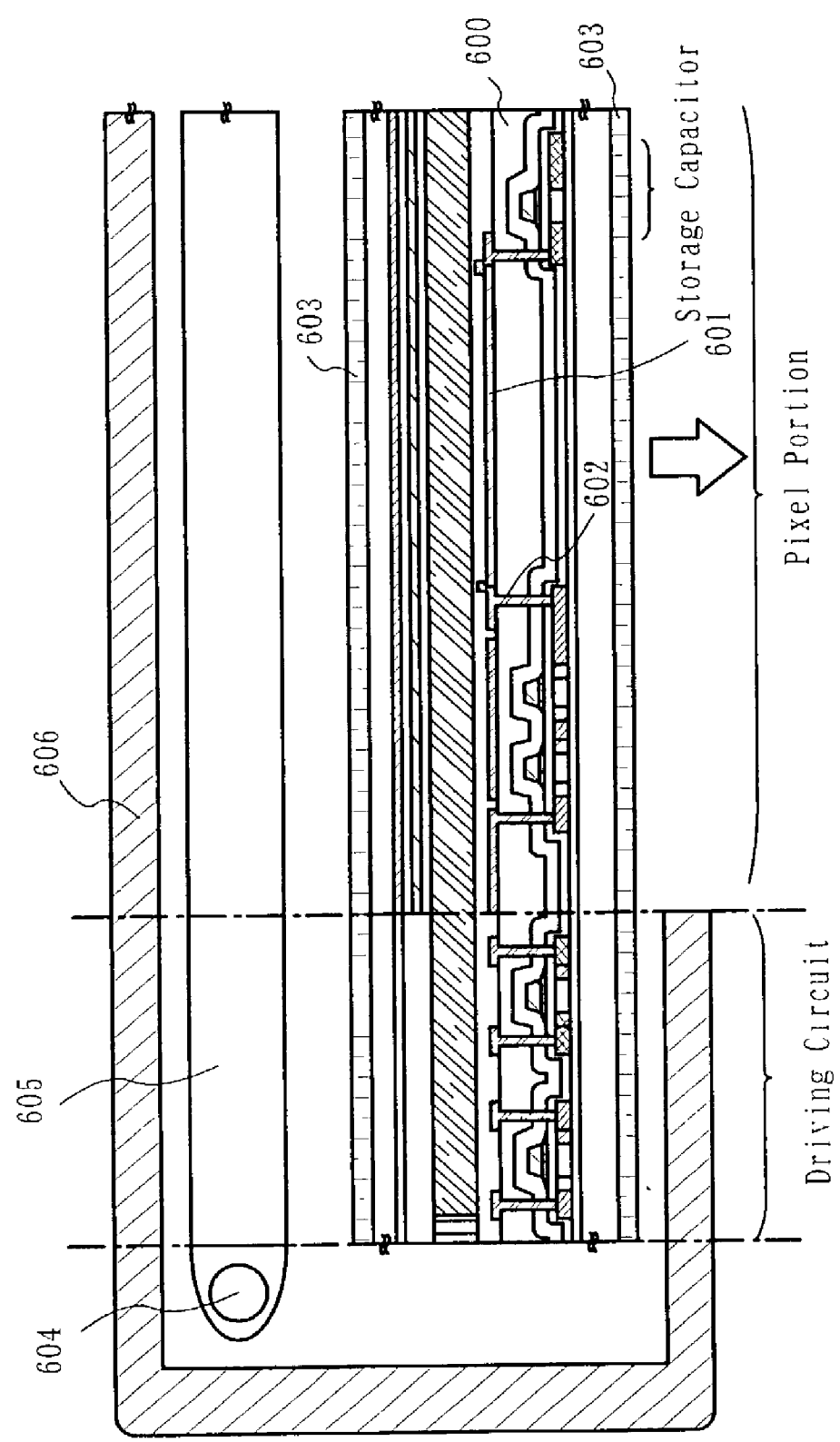
FIG. 12 is a sectional view of a transmission LCD.

Embodiment 1 shows an example of reflective display device in which a pixel electrode is formed from a reflective metal material. Shown in this embodiment is an example of transmissive display device in which a pixel electrode is formed from a light-transmitting conductive film (FIG. 12).

The manufacture process up through the step of forming an interlayer insulating film is identical with the process of Embodiment 1, and the description thereof is omitted here. After the interlayer insulating film is formed in accordance with Embodiment 1, a pixel electrode 601 is formed from a light-transmitting conductive film. Examples of the light-transmitting conductive film include an ITO (indium tin oxide alloy) film, an indium oxide-zinc oxide alloy ($In_2O_3$—ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole. At the same time the connection electrode is formed, source electrodes or drain electrodes of other TFTs are formed.

Although all of the driving circuits are formed on the substrate in the example shown here, several ICs may be used for some of the driving circuits.

An active matrix substrate is completed as above. A liquid crystal module is manufactured from this active matrix substrate in accordance with Embodiment 2. The liquid crystal module is provided with a backlight 604 and a light guiding plate 605, and is covered with a cover 606 to complete the active matrix liquid crystal display device of which a partial sectional view is shown in FIG. 12. The cover is bonded to the liquid crystal module using an adhesive or an organic resin. When bonding the substrate to the opposite substrate, the substrates may be framed so that the space between the frame and the substrates is filled with an organic resin for bonding. Since the display device is of transmissive type, the active matrix substrate and the opposite substrate each needs a polarizing plate 603 to be bonded.

This embodiment can be freely combined with any of Embodiments 1 and 2.

(Embodiment 4)

Figure 13A:
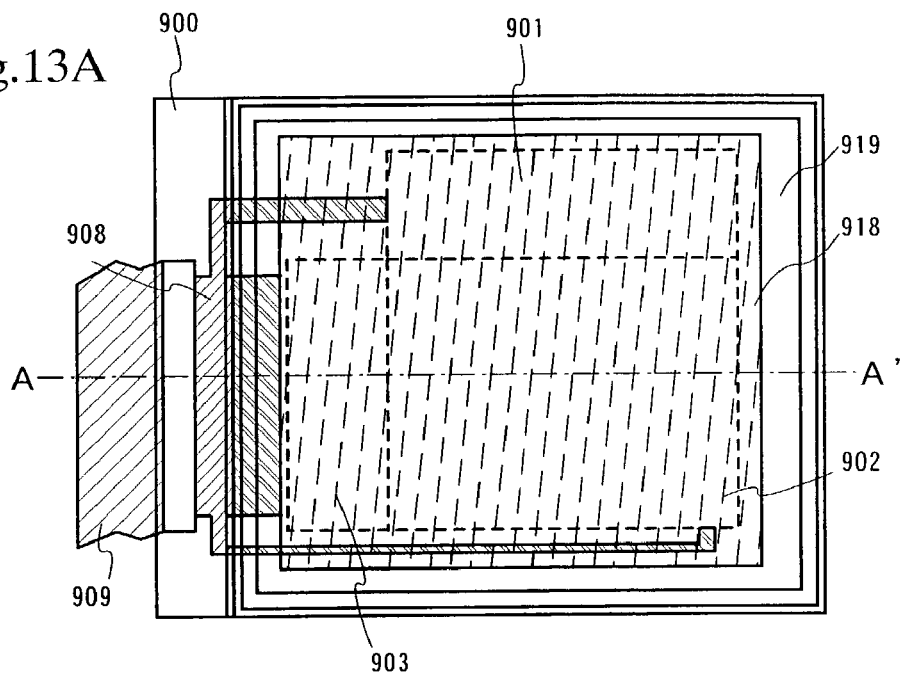
FIGS. 13A and 13B are structures of an active matrix EL display device.
Figure 13B:
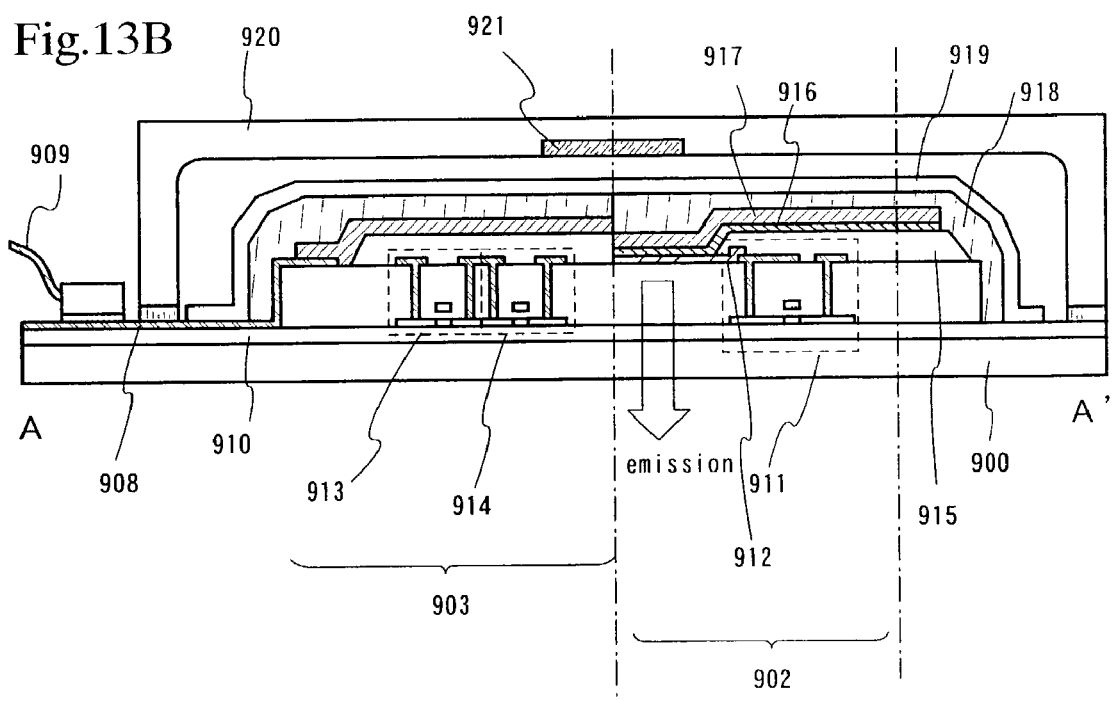

In this embodiment, an example of manufacturing a light emitting display device provided with an EL (electro luminescence) element is shown in FIGS. 13A and 13B.

FIG. 13A is a top view of an EL module, and FIG. 13B is a sectional view taken along a line A–A' of FIG. 13A. On a substrate 900 having an insulating surface (for example, a glass substrate, a crystallized glass substrate, a plastic substrate or the like), a pixel portion 902, a source side driver circuit 901, and a gate side driver circuit 903 are formed. The pixel portion and the driver circuits can be obtained in accordance with the above-described embodiments. Further, reference numeral 918 indicates a scaling member, and reference numeral 919 indicates a DLC film. The pixel portion and the driver circuit portions are covered by the sealing member 918, and the sealing member is covered by a protective film 919. Further, the protective film 919 is sealed by a cover member 920 using an adhesive. It is desirable that the cover member 920 is made of the same material as the substrate 900, for example, is a glass substrate in order to withstand deformation due to heat or external force. The cover member 920 is processed to have the convex shape (with a depth of 3 to 10 μm) shown in FIG. 13 by sandblasting or the like. It is desirable that the cover member 920 is further processed to form a convex portion (with a depth of 50 to 200 µm) into which a drying agent 921 can be arranged. Further, in the case where multiple EL modules are manufactured, after the substrate and the cover member are attached with each other, segmentation may be conducted using a $CO_2$ laser or the like such that end surfaces match with each other.

Note that reference numeral 908 indicates a wiring for transmitting signals input to the source side driver circuit 901 and the gate side driver circuit 903, and receives a video signal and a clock signal from an FPC (flexible printed circuit) 909 that is an external input terminal. Note that although only the FPC is shown in the figure, a printed wiring board (PWB) may be attached to the FPC. The light emitting device in this specification includes not only the main body of the light emitting device but also the light emitting device attached with the FPC or PWB.

Next, the sectional structure is described with reference to FIG. 13B. An insulating film 910 is provided on the substrate 900, the pixel portion 902 and the gate side driver circuit 903 are formed above the insulating film 910, and the pixel portion 902 is constituted of at plurality of pixels including a current control TFT 911 and a pixel electrode 912 electrically connected to a drain of the current control TFT 911. Further, the gate side driver circuit 903 is formed by using a CMOS circuit in which an n-channel TFT 913 and a p-channel TFT 914 are combined.

The above TFTs (including 911, 913, and 914) may be manufactured in accordance with the n-channel TFT 201 and the p-channel TFT 202 in Embodiment 1.

Note that, as to a material of the insulating film provided between the TFT and the EL element, it is appropriate to use a material that not only blocks diffusion of impurity ions such as alkali metal ions or alkaline-earth metal ions but also positively adsorbs the impurity ions such as alkali metal ions or alkaline-earth metal ions, and further to use a material that can withstand a subsequent process temperature. As the material that satisfies the above conditions, a silicon nitride film containing a large amount of fluorine is given as an example. The concentration of fluorine contained in the silicon nitride film is $1 \times 10^{19}/cm^3$ or more, and preferably, the composition ratio of fluorine in the silicon nitride film is 1 to 5%. Fluorine in the silicon nitride film bonds to alkali metal ions or alkaline-earth metal ions, and is adsorbed into the film. Further, as another example, there is given an organic resin film containing particulates comprised of a stibium (Sb) compound, a stannum (Sn) compound or an indium (In) compound, which adsorbs alkali metal ions, alkaline-earth metal ions or the like, for example, an organic resin film containing particulates of stibium pentoxide ($Sb_2O_5 \cdot nH_2O$). Note that this organic resin film contains particulates with all average particle size of 10 to 20 nm, and has high light transmission properties. The stibium compound typified by the stibium pentoxide particulates is likely to adsorb impurity ions such as alkali metal ions or alkaline-earth metal ions.

The pixel electrode 912 functions as an anode of a light emitting element (EL element). Further, banks 915 are formed at both ends of the pixel electrode 912, and an EL layer 916 and a cathode 917 of the light emitting element are formed on the pixel electrode 912.

As to the EL layer 916, a light emitting layer, a charge transportation layer and a charge injection layer may be freely combined to form an EL layer (layer for light emission and movement of carrier for light emission). For example, a low molecular weight organic EL material or a high molecular weight organic EL material may be used. Further, as the EL layer, a thin film formed from a light emitting material that emits light by singlet excitation (fluorescence) (singlet compound) or a thin film formed from a light emitting material that emits light by triplet excitation (phosphorescence) (triplet compound) can be used. Further, an inorganic material such as silicon carbide can be used for the charge transportation layer or the charge injection layer. Known materials can be used for the organic EL materials or inorganic materials.

A cathode 917 also functions as a wiring common to all the pixels, and is electrically connected to the FPC 909 through the connection wiring 908. Further, all the elements contained in the pixel portion 902 and the gate side driver circuit 903 are covered by the cathode 917, the sealing member 918 and the protective film 919.

Note that a material that is transparent or semitransparent to visible light is preferably used for the sealing member 918. Further, the sealing member 918 is desirably formed from a material that does not permeate moisture or oxygen as much as possible.

Further, after the light emitting element is completely covered by the sealing member 918, it is preferable that the protective film 919 comprised of a DLC film or the like is provided at least on the surface (exposed surface) of the sealing member 918 as shown in FIGS. 13A and 13B. Further, the protective film may be provided on the entire surface including the back surface of the substrate. Here, it is necessary that attention is paid to in order that the protective film is not deposited to the portion where the external input terminal (FPC) is provided. A mask may be used in order not to form the protective film. Alternatively, the external input terminal portion may be covered a masking tape used in a CVD apparatus in order not to form the protective film.

The light emitting element is sealed by the sealing member 918 and the protective film with the above-described structure, whereby the light emitting element call be completely shut from the outside. Thus, it is possible to prevent a substance that promotes deterioration due to oxidization of the EL layer, such as moisture or oxygen from permeating from the outside. Therefore, the light emitting device with high reliability can be obtained.

Figure 14:
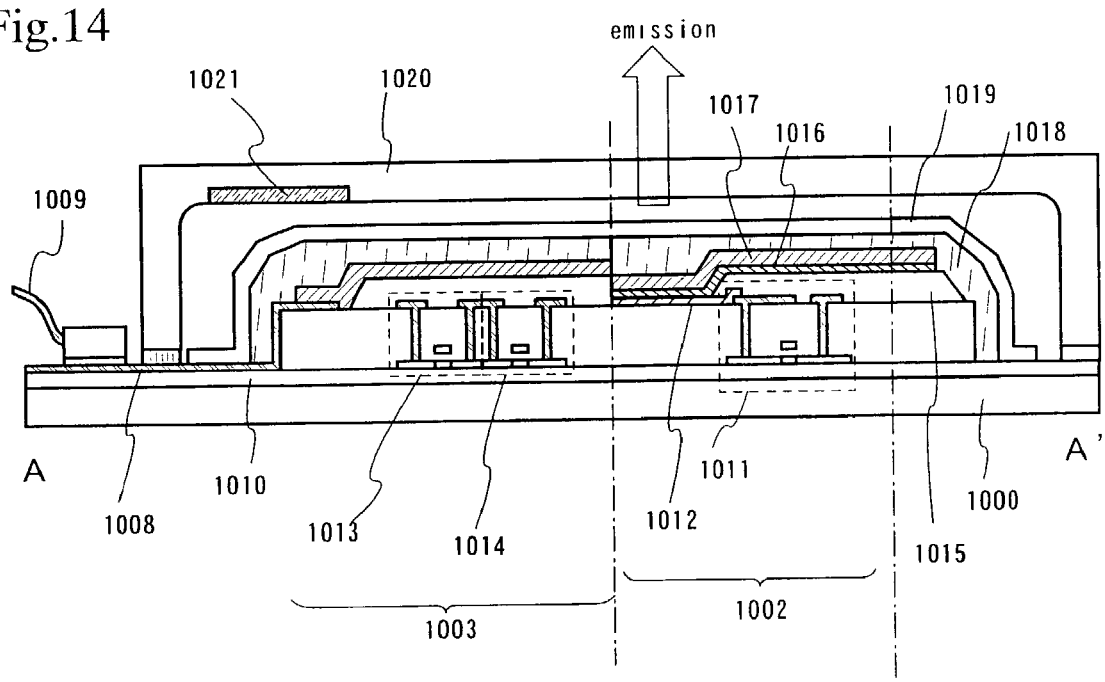
FIG. 14 is a structure of an active matrix EL display device.

Further, the structure may be adopted in which a pixel electrode is a cathode, and an EL layer and an anode are laminated to thereby provide light emission in an opposite direction to that in FIGS. 13A and 13B. FIG. 14 shows an example thereof. Note that a top view of the example is the same as that of FIG. 13A, and thus is omitted.

A sectional structure shown in FIG. 14 is described below. As a substrate 1000, a semiconductor substrate or a metal substrate can be used besides a glass substrate and a quartz substrate. An insulating film 1010 is provided on the substrate 1000, a pixel portion 1002 and a gate side driver circuit 1003 are formed above the insulating film 1010, the pixel portion 1002 is constituted of a plurality of pixels including a current control TFT 1011 and a pixel electrode 1012 electrically connected to a drain of the current control TFT 1011. Further, the gate side driver circuit 1003 is formed by using a CMOS circuit in which an n-channel TFT 1013 and a p-channel TFT 1014 are combined.

The pixel electrode 1012 functions as a cathode of a light emitting element. Further, banks 1015 are formed at both ends of the pixel electrode 1012, and an EL layer 1016 and an anode 1017 of the light emitting element are formed on the pixel electrode 1012.

The anode 1017 also functions as a wiring common to all the pixels, and is electrically connected to an FPC 1009 via a connection wiring 1008. Further, all the elements contained in the pixel portion 1002 and the gate side driver circuit 1003 are covered by the anode 1017, a sealing member 1018 and a protective film 1019 comprised of DLC film or the like. Further, a cover member 1020 and the substrate 1000 are bonded by an adhesive. In addition, a concave portion is provided in the cover member, and a drying agent 1021 is arranged therein.

Note that a material that is transparent or semitransparent to visible light is preferably used for the sealing member 1018. Further, the sealing member 1018 is desirably formed from a material that does not permeate moisture and oxygen as much as possible.

Further, in FIG. 14, the pixel electrode is the cathode, and the EL layer and the anode are laminated. Thus, the light emission direction is indicated by an arrow in FIG. 14.

In this embodiment, the TFT with high electrical characteristics and high reliability which is obtained in Embodiment 1 is used, and therefore, there call be formed a light emitting element with higher reliability compared with a conventional element. Further, a light emitting device having such a light emitting element is used as a display portion. Thus, an electric equipment with high performance can be obtained.

Note that this embodiment can be freely combined with Embodiment 1.

(Embodiment 5)

The driver circuit and the pixel portion formed by implementing the present invention can be used in various modules (active matrix type liquid crystal module, active matrix type EL module and active matrix type EC module). That is, the present invention can be implemented in all of electronic equipments integrated with the modules at display portions thereof.

As such electronic equipment, there are pointed out a video camera, a digital camera, a head mount display (goggle type display), a car navigation system, a projector, a car stereo, a personal computer, a portable information terminal (mobile computer, cellular phone or electronic book) and the like. Examples of these are shown in FIGS. 15A to 17C.

Figure 15A:
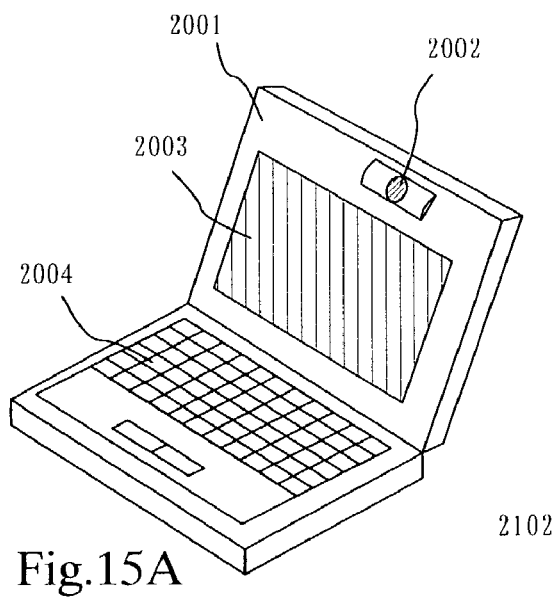
FIGS. 15A to 15F show examples of electronic devices.

FIG. 15A shows a personal computer including a main body 2001, an image input portion 2002, a display portion 2003, a keyboard 2004 and the like.

Figure 15B:
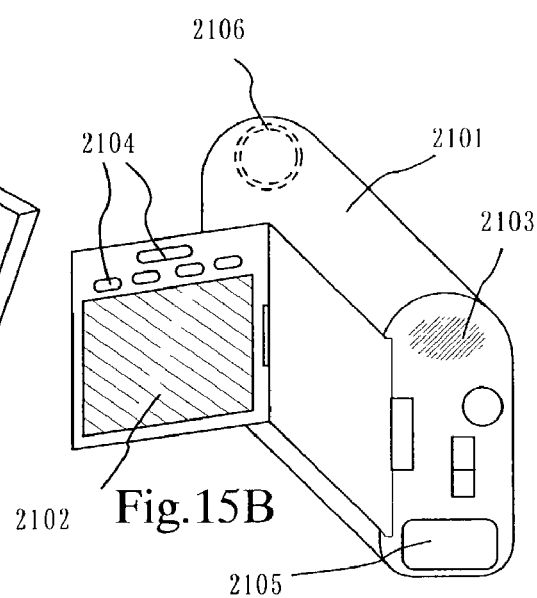

FIG. 15B shows a video camera including a main body 2101, a display portion 2102, a voice input portion 2103, operation switches 2104, a battery 2105, an image receiving portion 2106 and the like.

Figure 15C:
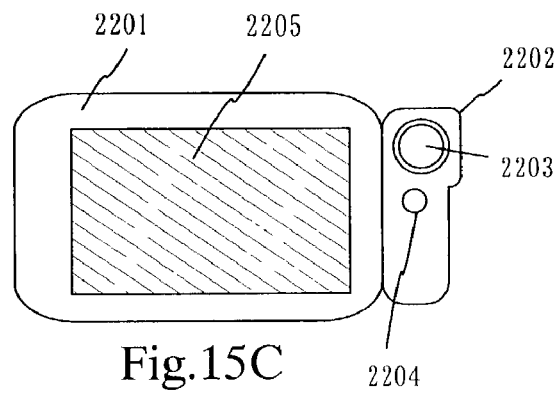

FIG. 15C shows a mobile computer including a main body 2201, a camera portion 2202, an image receiving portion 2203, an operation switch 2204, a display portion 2205 and the like.

Figure 15D:
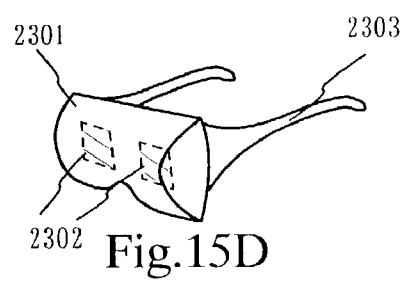
Figure 15E:
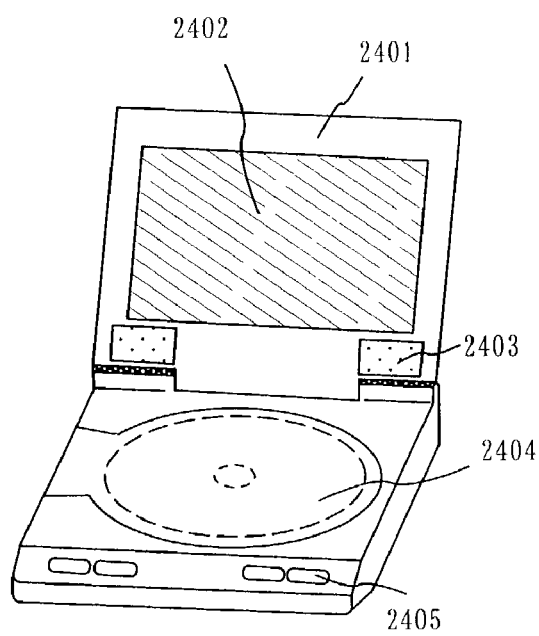

FIG. 15D shows a goggle type display including a main body 2301, a display portion 2302, an arm portion 2303 and the like. FIG. 15E shows a player using a record medium recorded with programs (hereinafter, referred to as record medium) including a main body 2401, a display portion 2402, a speaker portion 2403, a record medium 2404, an operation switch 2405 and the like. Note that the player uses DVD (digital Versatile Disc), CD or the like as the record medium and can enjoy music, enjoy movie and carry out game or Internet.

Figure 15F:
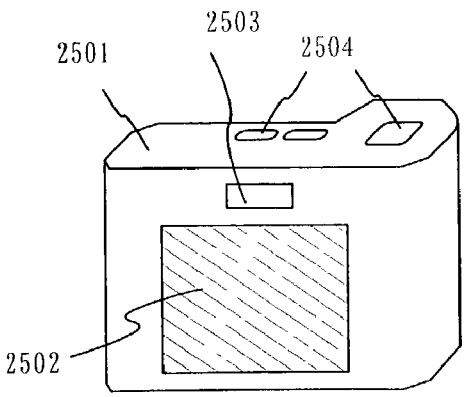

FIG. 15F shows a digital camera including a main body 2501, a display portion 2502, an eye contact portion 2503, operation switches 2504 and an image receiving portion (not illustrated).

Figure 16A:
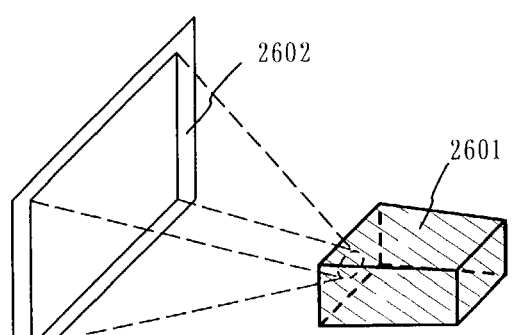
FIGS. 16A to 16D show examples of electronic devices.

FIG. 16A shows a front type projector including a projection equipment 2601, a screen 2602 and the like. A whole device can be completed by applying Embodiment 3 to the liquid crystal module 2808 forming a part of the projection equipment 2601.

Figure 16B:
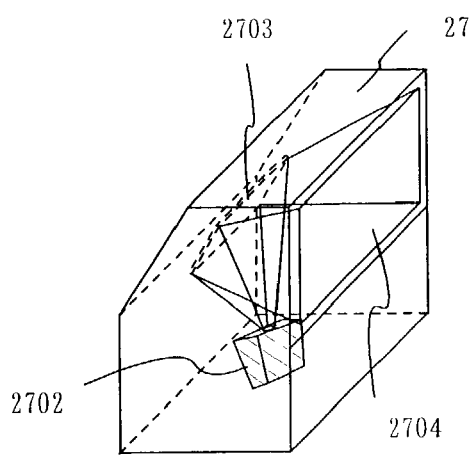

FIG. 16B shows a rear type projector including a main body 2701, a projection equipment 2702, a mirror 2703, a screen 2704 and the like. A whole device can be completed by applying Embodiment 3 to the liquid crystal module 2808 forming a part of the projection equipment 2702.

Figure 16C:
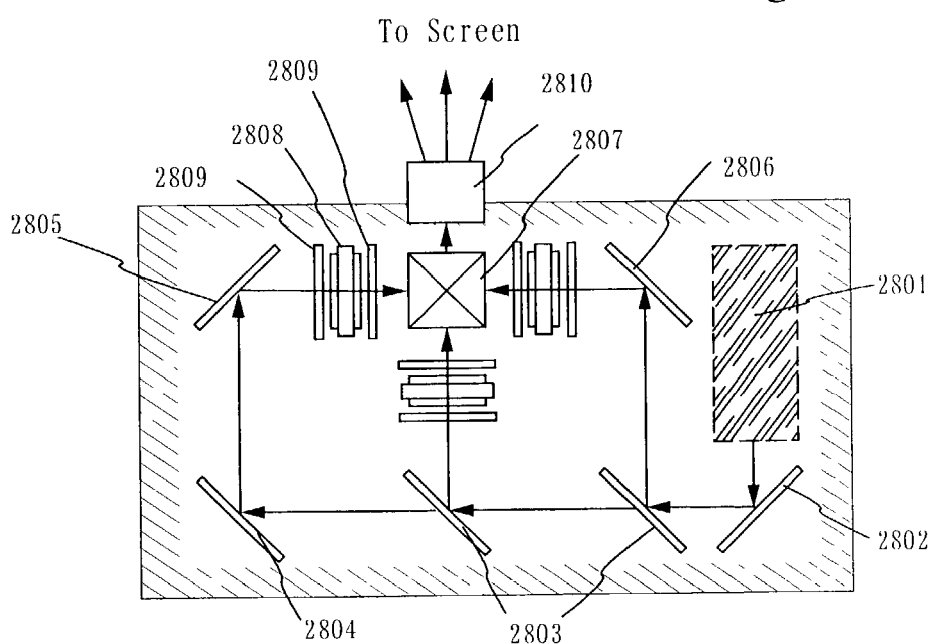

Further, FIG. 16C is a view showing an example of a structure of the projection equipment 2601 and 2702 in FIG. 16A and FIG. 16B. The projection equipment 2601 or 2702 is constituted by a light source optical system 2801, mirrors 2802, and 2804 through 2806, a dichroic mirror 2803, a prism 2807, a liquid crystal module 2808, a phase difference plate 2809 and a projection optical system 2810. The projection optical system 2810 is constituted by an optical system including a projection lens. Although this embodiment shows an example of three plates type, this embodiment is not particularly limited thereto but may be of, for example, a single plate type. Further, person of executing this embodiment may pertinently provide an optical system such as an optical lens, a film having a polarization function, a film for adjusting a phase difference or an IR film in an optical path shown by arrow marks in FIG. 16C.

Figure 16D:
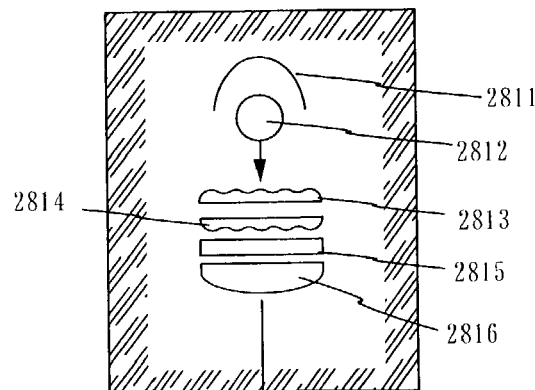

Further, FIG. 16D is a view showing an example of a structure of the light source optical system 2801 in FIG. 16C. According to this embodiment, the light source optical system 2801 is constituted by a reflector 2811, a light source 2812, lens arrays 2813 and 2814, a polarization conversion element 2815 and a focusing lens 2816. Further, the light source optical system shown in FIG. 16D is only an example and this example is not particularly limited thereto. For example, a person of executing this embodiment may pertinently provide an optical system such as an optical lens, a film having a polarization functions, a film for adjusting a phase difference or an IR film in the light source optical system.

However, according to the projectors shown in FIGS. 16A thorough 16D, there is shown a case of using a transmission type electro-optical device and an example of applying a reflection type electro-optical device and EL module are not illustrated.

Figure 17A:
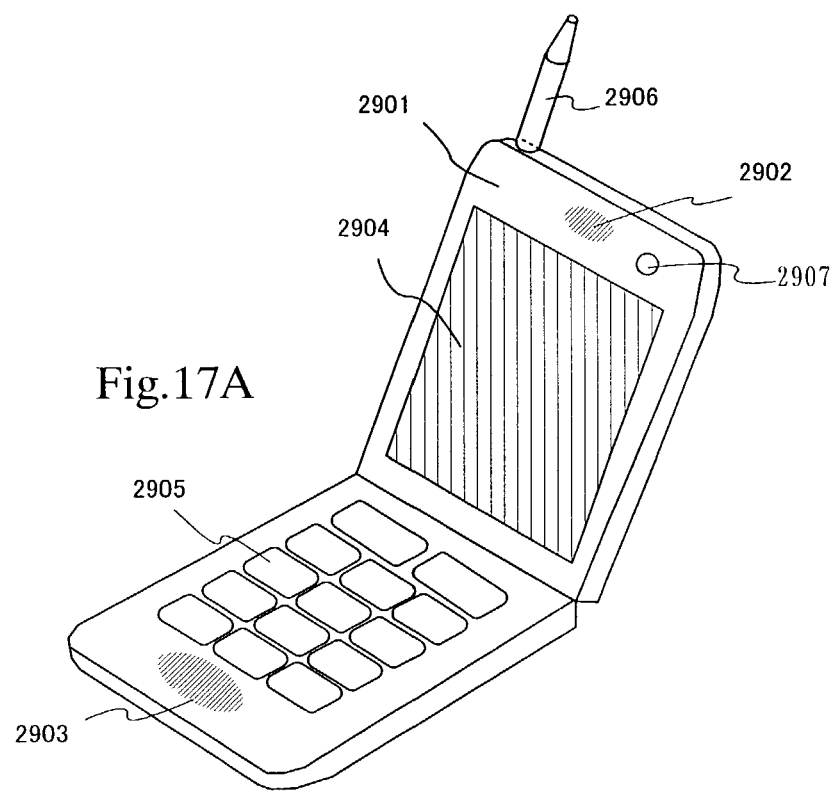
FIGS. 17A to 17C show examples of electronic devices.
Figure 17B:
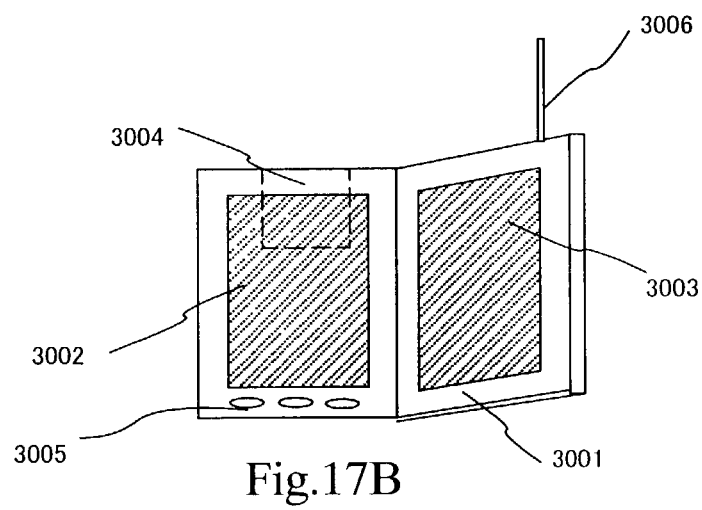

FIG. 17A shows a cellular phone including a main body 2901, a sound output portion 2902, a sound input portion 2903, a display portion 2904, an operation switch 2905, an antenna 2906, an image input portion (CCD, image sensor or the like) 2907 and the like. FIG. 17B shows a portable book (electronic book) including a main body 3001, display portions 3002 and 3003, a record medium 3004, an operation switch 3005, an antenna 3006 and the like.

Figure 17C:
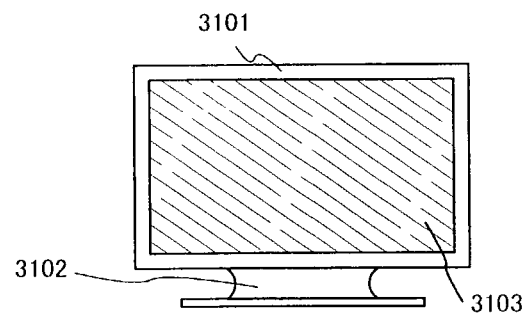
Figure 18:
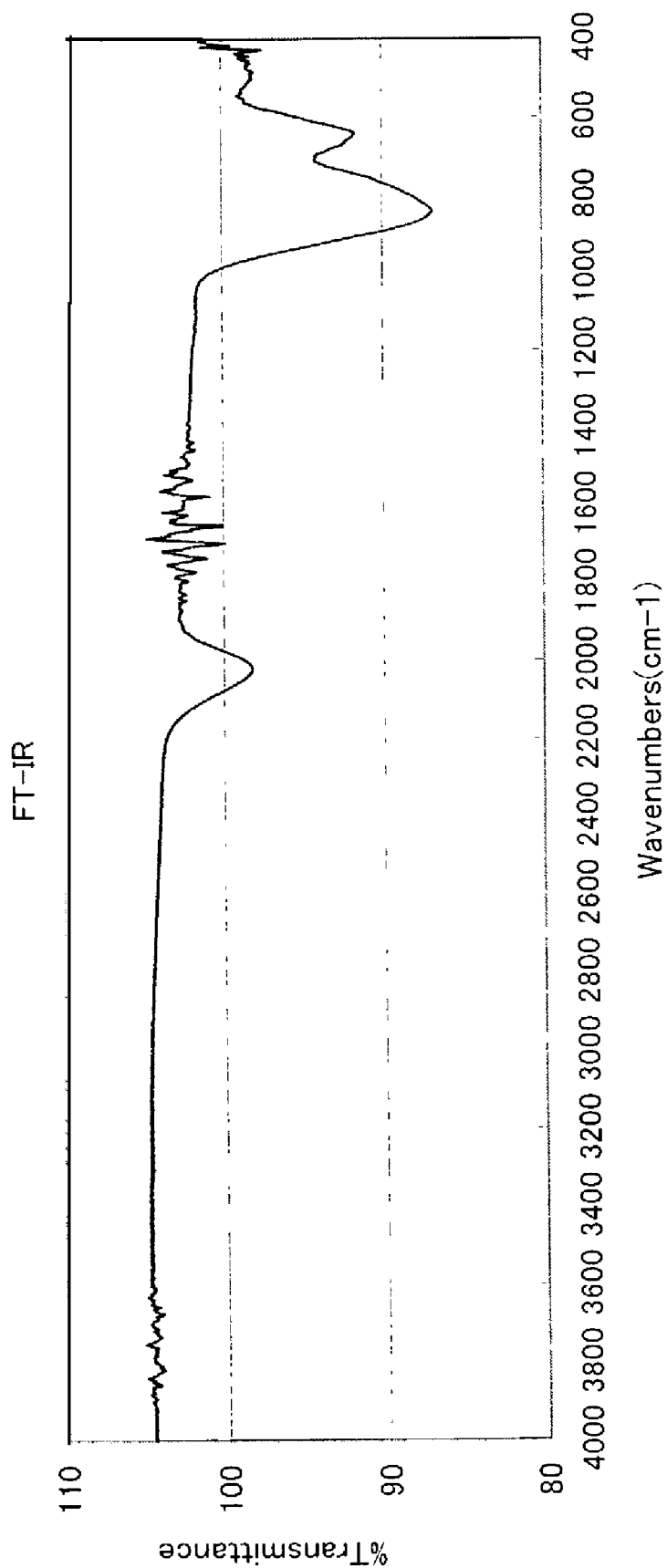
FIG. 18 is a graph indicating spectral data by an FT-IR method.
Figure 19:
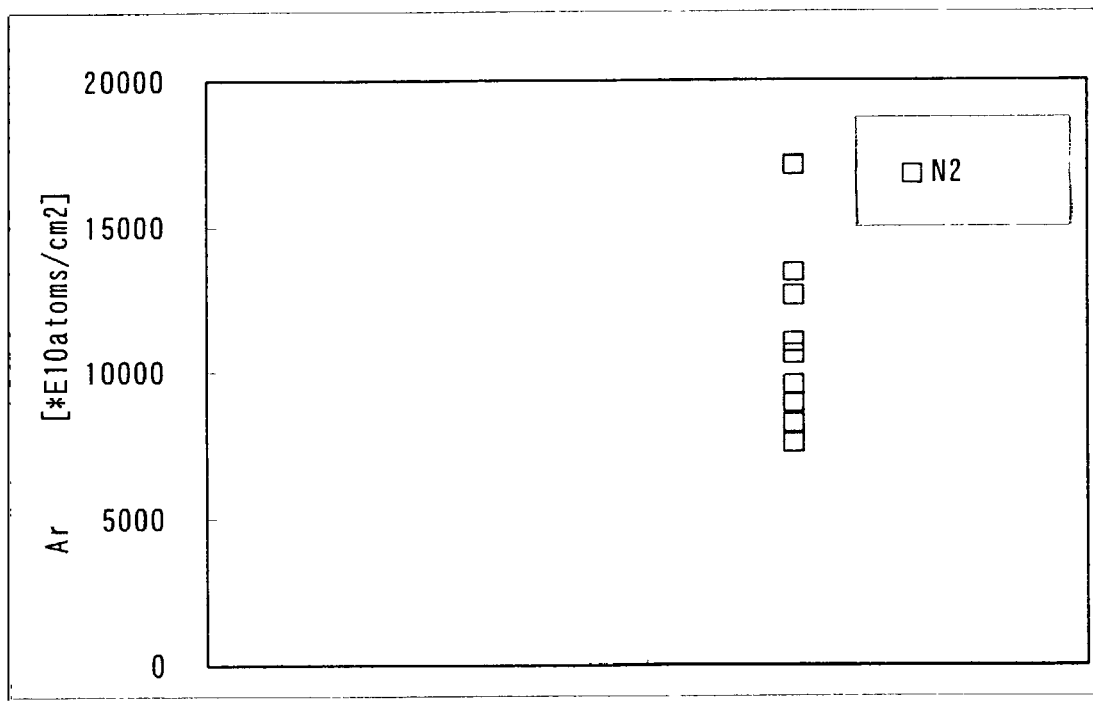
FIG. 19 is a graph indicating a concentration of argon in the surface of an amorphous silicon film according to the present invention.

FIG. 17C shows a display including a main body 3101, a support base 3102, a display portion 3103 and the like.

In addition, the display shown in FIG. 17C is small and medium type or large type, for example, screen of the display sized 5 to 20 inches. Moreover, it is preferable to mass-produce by executing a multiple pattern using a substrate sized 1×1 m to form such sized display section.

As has been described, the range of applying the present invention is extremely wide and is applicable to electronic equipment of all the fields. The electronic equipment of the present invention can be implemented by freely combined with the structures in Embodiments 1 to 4.

According to the present invention, the amorphous silicon film which includes argon at a high concentration, specifically, a concentration of $1\times10^{20}/cm^3$ to $1\times10^{21}/cm^3$ and has a concentration of nitrogen of $1\times10^{20}/cm^3$ to $1\times10^{21}/cm^3$ can be formed by a plasma CVD method.

Also, according to the present invention, the semiconductor film having the crystalline structure in which the metallic element for promoting crystallization is sufficiently reduced or removed can be obtained. Thus, improvement of an electrical characteristic and a reduction in a variation between respective elements can be achieved in a TFT using the semiconductor film as an active layer. Particularly, in the case of a liquid crystal display device, uneven display due to a variation in TFT characteristics can be reduced.

In addition, in the case of a semiconductor device having an OLED, a variation in an on current (Ion) of a TFT located so as to flow a constant current into a pixel electrode (TFT for supplying a current to an OLED located in a driver circuit or a pixel) can be reduced. Thus, a variation in luminance can be reduced.

Also, according to the present invention, not only the metallic element for promoting crystallization but also other metallic elements (Fe, Cu, and the like) as impurities can be removed or reduced.

What is claimed is:

1. A method of manufacturing a semiconductor device, comprising:
   introducing a raw gas comprising silane, noble gas, and nitrogen into a film formation chamber; and
   forming a semiconductor film comprising the noble gas element and nitrogen over a substrate, by generating a plasma,
   wherein the noble gas element with a concentration of $1 \times 10^{18}/cm^3$ to $1 \times 10^{22}/cm^3$ is included in the semiconductor film.

2. A method of manufacturing a semiconductor device according to claim 1, wherein a pressure in the film formation chamber is 2.666 Pa to 133.3 Pa when the plasma is generated.

3. A method of manufacturing a semiconductor device according to claim 1, wherein a flow rate of nitrogen to the noble gas ($N_2$/ noble gas) is controlled to be in a range of 0.2 to 5.

4. A method of manufacturing a semiconductor device according to claim 1, wherein an RF power density for generating the plasma is 0.0017 $W/cm^2$ to 1 $W/cm^2$.

5. A method of manufacturing a semiconductor device according to claim 1, wherein nitrogen with a concentration of $1 \times 10^{18}/cm^3$ to $1 \times 10^{22}/cm^3$ is included in the semiconductor film.

6. A method of manufacturing a semiconductor device according to claim 1, wherein the noble gas element is one kind or plural kinds of elements selected from the group consisting of He, Ne, Ar, Kr, and Xe.

7. A method of manufacturing a semiconductor device according to claim 1, wherein the silane is monosilane and a flow rate of the monosilane to the noble gas ($SiH_4$:noble gas) is controlled to be 0.1:99.9 to 1:9.

8. A method of manufacturing a semiconductor device according to claim 1, wherein the silane is monosilane and a flow rate of the monosilane to the noble gas ($SiH_4$:noble gas) is controlled to be 0.1:99.9 to 5:95.

9. A method of manufacturing a semiconductor device comprising:
   forming a first semiconductor film having an amorphous structure on an insulating surface;
   adding a metallic element to the first semiconductor film;
   crystallizing the first semiconductor film to form a first semiconductor film having a crystalline structure;
   forming a barrier layer on a surface of the first semiconductor film having the crystalline structure;
   forming a second semiconductor film comprising a noble gas element and nitrogen on the barrier layer by a plasma CVD method;
   gettering the metallic element to the second semiconductor film to remove or reduce the metallic element in the first semiconductor film having the crystalline structure; and
   removing the second semiconductor film.

10. A method of manufacturing a semiconductor device according to claim 9, wherein the second semiconductor film is formed by introducing a raw gas comprising monosilane, noble gas, and nitrogen into a film formation chamber and then generating a plasma.

11. A method of manufacturing a semiconductor device according to claim 9, wherein the metallic element is one kind or plural kinds of elements selected from the group consisting of Fe, Ni, Co, Ru, Rh, Pd, Os, Ir, Pt, Cu, and Au.

12. A method of manufacturing a semiconductor device, comprising:
   forming a gate electrode over a substrate;
   forming a gate insulating film on the gate electrode;
   introducing a raw gas including silane, noble gas and nitrogen and generating a plasma;
   forming an amorphous semiconductor film comprising the noble gas element at a concentration of $1 \times 10^{18}/cm^3$ to $1 \times 10^{22}/cm^3$; and
   patterning the amorphous semiconductor film.

13. A method of manufacturing a semiconductor device according to claim 12, wherein a pressure in the film formation chamber is 2.666 Pa to 133.3 Pa when the plasma is generated.

14. A method of manufacturing a semiconductor device according to claim 12, wherein a flow rate of nitrogen to the noble gas ($N_2$/noble gas) is controlled to be in a range of 0.2 to 5.

15. A method of manufacturing a semiconductor device according to claim 12, wherein an RF power density for generating the plasma is 0.0017 $W/cm^2$ to 1 $W/cm^2$.

16. A method of manufacturing a semiconductor device according to claim 12, wherein nitrogen with a concentration of $1 \times 10^{18}/cm^3$ to $1 \times 10^{22}/cm^3$ is included in the amorphous semiconductor film.

17. A method of manufacturing a semiconductor device according to claim 12, wherein the noble gas element is one kind or plural kinds of elements selected from the group consisting of He, Ne, Ar, Kr, and Xe.

18. A method of manufacturing a semiconductor device according to claim 12, wherein the silane is monosilane and a flow rate of the monosilane to the noble gas ($SiH_4$:noble gas) is controlled to be 0.1:99.9 to 1:9.

19. A method of manufacturing a semiconductor device according to claim 12, wherein the silane is monosilane and a flow rate of the monosilane to the noble gas ($SiH_4$:noble gas) is controlled to be 1:99 to 5:95.

20. A method of manufacturing a semiconductor device comprising:
   forming a first semiconductor film on an insulating surface;
   forming a barrier layer on a surface of the first semiconductor film;
   forming a second semiconductor film comprising a noble gas element and nitrogen on the barrier layer by a plasma CVD method;
   gettering a metallic element included in the first semiconductor film into the second semiconductor film to remove or reduce the metallic element; and
   removing the second semiconductor film.

21. A method of manufacturing a semiconductor device according to claim 20, wherein the second semiconductor film is formed by introducing a raw gas comprising monosilane, noble gas, and nitrogen into a film formation chamber and then generating a plasma.

22. A method of manufacturing a semiconductor device according to claim 21, wherein a flow rate of the monosilane to the noble gas ($SiH_4$:noble gas) is controlled to be 0.1:99.9 to 1:9.

23. A method of manufacturing a semiconductor device according to claim 21, wherein a flow rate of the monosilane to the noble gas ($SiH_4$:noble gas) is controlled to be 1:99 to 5:95.

* * * * *